(12) United States Patent
Ishimaru et al.

(10) Patent No.: US 7,573,336 B2
(45) Date of Patent: Aug. 11, 2009

(54) POWER AMPLIFIER AND MULTISTAGE AMPLIFICATION CIRCUIT INCLUDING SAME

(75) Inventors: Yoshiteru Ishimaru, Tenri (JP); Motoko Furukawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/010,592

(22) Filed: Jan. 28, 2008

(65) Prior Publication Data

US 2008/0186099 A1    Aug. 7, 2008

(30) Foreign Application Priority Data

Feb. 1, 2007    (JP) ............................ 2007-023486

(51) Int. Cl.
H03F 3/04    (2006.01)

(52) U.S. Cl. ....................... 330/296; 330/288; 330/310

(58) Field of Classification Search .................. 330/296, 330/288, 310
See application file for complete search history.

(56) References Cited

U.S. PATENT DOCUMENTS

| | | | |
|---|---|---|---|
| 5,357,149 A | 10/1994 | Kimura | |
| 5,373,226 A | 12/1994 | Kimura | |
| 5,512,855 A | 4/1996 | Kimura | |
| 5,627,461 A | 5/1997 | Kimura | |
| 5,670,912 A * | 9/1997 | Zocher | 330/296 |
| 5,838,188 A | 11/1998 | Taguchi | |
| 6,225,855 B1 | 5/2001 | Taguchi | |
| 6,404,287 B2 * | 6/2002 | Dening et al. | 330/296 |
| 6,492,874 B1 * | 12/2002 | Shih | 330/288 |
| 6,842,075 B2 * | 1/2005 | Johnson et al. | 330/296 |
| 7,019,508 B2 | 3/2006 | Rategh et al. | |
| 7,365,604 B2 * | 4/2008 | Luo et al. | 330/296 |
| 7,400,202 B2 * | 7/2008 | Yamamoto et al. | 330/296 |
| 2001/0005160 A1 | 6/2001 | Taguchi | |
| 2001/0054933 A1 | 12/2001 | Miyazawa | |
| 2005/0184806 A1 | 8/2005 | Koizumi | |
| 2006/0033577 A1 | 2/2006 | Nakamizo et al. | |

FOREIGN PATENT DOCUMENTS

| | | |
|---|---|---|
| JP | 46-16463 | 5/1971 |
| JP | 05-119862 | 5/1993 |
| JP | 05-191166 | 7/1993 |
| JP | 05-191167 | 7/1993 |

(Continued)

*Primary Examiner*—Patricia Nguyen
(74) *Attorney, Agent, or Firm*—Harness, Dickey & Pierce, P.L.C.

(57) ABSTRACT

A bias circuit 22 in a power amplifier 1 is provided with a VBE-controlled voltage source circuit 20 and a Nagata current mirror circuit 21. The Nagata current mirror circuit 21 includes a transistor Tr5 and a transistor Tr6. The transistor Tr5 has its emitter grounded, its base connected to a control input terminal 17 via a resistor R3, and its collector connected to that base via a resistor R4. The transistor Tr6 has its emitter grounded, its base connected to the collector of the transistor Tr5, and its collector connected to the base of the transistor Tr3. The arrangement is capable of compensating both the temperature characteristics of the gain of the power amplifier 1 and the control input voltage characteristics of the gain of the power amplifier 1. In other words, the arrangement is capable of reducing the temperature dependence and control input voltage dependence of the gain of the power amplifier 1.

7 Claims, 16 Drawing Sheets

FOREIGN PATENT DOCUMENTS

| | | |
|---|---|---|
| JP | 05-191168 | 7/1993 |
| JP | 07-73670 | 3/1995 |
| JP | 07-200086 | 8/1995 |
| JP | 2002-009558 | 1/2002 |
| JP | 2005-244442 | 9/2005 |
| WO | 2004/086613 | 10/2004 |

\* cited by examiner

US 7,573,336 B2

POWER AMPLIFIER AND MULTISTAGE AMPLIFICATION CIRCUIT INCLUDING SAME

This nonprovisional application claims priority under 35 U.S.C. § 119(a) on Patent Application No. 2007-023486 filed in Japan on Feb. 1, 2007, the entire contents of which are hereby incorporated by reference.

FIELD OF THE INVENTION

The present invention relates to power amplifiers with a bias circuit for compensating a temperature characteristic of the power amplifiers and also relates to multistage amplification circuits including such a power amplifier.

BACKGROUND OF THE INVENTION

Bipolar transistors are conventional, popular amplifying components for power amplifiers for amplifying, for example, signals. For example, in a bipolar transistor used as an amplifying component, the base-emitter ON voltage (VBE) drops at high temperatures. So, the collector current increases with a rise in ambient temperature if the bias voltage applied to the base is constant.

To compensate this particular temperature characteristic to achieve stability of the power amplifier, the conventional power amplifier includes a "VBE-controlled voltage source circuit" as a temperature compensation circuit in a bias circuit supplying a bias voltage to the amplifying component of the power amplifier. The VBE-controlled voltage source circuit produces an output voltage according to the VBE of a transistor included in the circuit. This type of power amplifier including the VBE-controlled voltage source circuit is disclosed in, for example, Japanese Unexamined Patent Publication (Tokukai) 2002-009558 (published Jan. 11, 2002).

FIG. 24 is a schematic circuit diagram of the power amplifier disclosed in Tokukai 2002-009558. A power amplifier 100 includes, as illustrated in FIG. 24, an amplification transistor Tr101, an input matching circuit 102, an output matching circuit 103, a resistor R101, and a bias circuit 110. The base of the amplification transistor Tr101 is connected to an input signal terminal 101 of the power amplifier 100 via the input matching circuit 102. The collector of the amplification transistor Tr101 is connected to an output signal terminal 104 of the power amplifier 100 via the output matching circuit 103. In the power amplifier 100 structured that way, a high frequency signal fed at the input signal terminal 101 goes through the input matching circuit 102, amplified by the amplification transistor Tr101, goes through the output matching circuit 103, and output at the output signal terminal 104. Furthermore, the base of the amplification transistor Tr101 is connected via the resistor R101 to the bias circuit 110. To the collector of the amplification transistor Tr101 is connected a power supply terminal 105 supplying a bias voltage to the amplification transistor Tr101.

The bias circuit 110 includes transistors Tr102, Tr103, Tr104, Tr105, resistors R102, R103, power supply terminals 106, 108, and a control input terminal 107. The transistors Tr103, Tr104, the resistors R102, R103, the control input terminal 107, and the power supply terminal 108 constitutes a VBE-controlled voltage source circuit 109.

The transistor Tr102 supplies a bias current to the amplification transistor Tr101 according to a control input voltage that is fed to the bias circuit 110 as a control signal. The emitter of the transistor Tr102 is connected via the resistor R101 to the base of the amplification transistor Tr101. The resistor R101 is a stabilization resistor (ballast resistor) for the prevention of thermal-runaway of the amplification transistor Tr101. The collector of the transistor Tr102 is connected to a power supply terminal 106.

The transistor Tr105 controls the bias current. Accordingly, the power amplifier 100 is able to regulate in some cases the collector current in the presence of variations in the control input voltage. The collector of the transistor Tr105 is connected to the emitter of the transistor Tr102. The emitter of the transistor Tr105 is grounded. The transistor Tr105 may be omitted depending on the structure of the bias circuit 110.

The VBE-controlled voltage source circuit 109 has functions of lowering the sensitivity of the bias current of the power amplifier 100 to variations in the control input voltage and reducing temperature-induced variations in the collector current of the amplification transistor Tr101.

Specifically, the transistors Tr103 and Tr104 are cascaded to compensate temperature characteristics of the power amplifier 100. The collector of the transistor Tr103 is connected to the base of the transistor Tr104. Those collector and base are connected to the control input terminal 107 via the resistor R102. The power amplifier 100 receives, at the control input terminal 107, a control input voltage as a control signal from an external circuit (not shown). The base of the transistor Tr103 is connected to the emitter of the transistor Tr104. Those base and emitter are connected to the base of the transistor Tr105 and also grounded via the resistor R103. The collector of the transistor Tr104 is connected to the power supply terminal 108. In addition, in Tokukai 2002-009558, the power supply terminals 106, 108 are connected to the same external power supply.

In the structure, the output voltage of the VBE-controlled voltage source circuit 109 is equal to the sum of the VBE of the transistor Tr103 and the VBE of the transistor Tr104, that is, about twice the VBE. The base voltage of the transistor Tr104 acts also as the base voltage of the transistor Tr102. To obtain a constant collector current for the amplification transistor Tr101, the bias voltage applied to the base of the transistor Tr102 should be reduced with in temperature rise. Meanwhile, the output voltage (twice the VBE) of the VBE-controlled voltage source circuit 109 tends to decrease with temperature rise. Thus, the power amplifier 100 can restrain variations in the collector current induced by temperature.

Japanese Unexamined Patent Publication 7-200086/1995 (Tokukaihei 7-200086; published Aug. 4, 1995) discloses a reference current circuit incorporating a current mirror circuit called a Nagata current mirror circuit. In that type of current mirror circuit, the mirror current increases with an increase in the reference current, reaches a peak at a certain reference current, and decreases at higher reference currents. Tokukaihei 7-200086 enables the reference current circuit to change its role and operate as a reference voltage circuit or double as a reference voltage circuit, without adding to circuit size, by applying the Nagata current mirror circuit to the reference current circuit.

New mobile phones and communications devices used as wireless network devices need a power amplifier which exhibits reduced temperature dependence to improve wireless transmission capability, in particular, a power amplifier with very small gain variations with temperature. The power amplifier 100 of Tokukai 2002-009558 shown in FIG. 24 exhibits only small changes with temperature in the collector current of the amplification transistor Tr101, but allows decreases in the gain of the power amplifier 100 at high temperatures.

Tokukai 2002-009558 discloses another structure: there is provided in the bias circuit 110 an additional bias circuit that includes a second control input terminal other than the control input terminal 107, a resistor, and two current fine-adjusting transistors. The collector and emitter of one of the current fine-adjusting transistors are connected to the bias circuit 110. The base of this current fine-adjusting transistor is connected to the collector and base of the other current fine-adjusting transistor. The emitters of the two current fine-adjusting transistors are connected together.

The structure enables fine adjustment of the bias current by adjusting the control input voltage at the second control input terminal in an ON state while switching on/off the bias current according to the input signal fed from the control input terminal 107.

However, the two current fine-adjusting transistors of the bias circuit additionally provided in the bias circuit 110 constitute a plain current mirror circuit. Therefore, with this structure, it is still difficult to restrain gain variations in the power amplifier.

Tokukaihei 7-200086 does not disclose a Nagata current mirror circuit being adopted as a current source in the VBE-controlled voltage source circuit to regulate the temperature dependence and control input voltage dependence of the reference current circuit. Tokukaihei 7-200086, again, does not disclose the combination of the VBE-controlled voltage source circuit and the Nagata current mirror circuit being used for gain compensation in the power amplifier 100.

SUMMARY OF THE INVENTION

The present invention, conceived in view of the problems, has an objective of providing a power amplifier having a gain which exhibits restrained dependence on temperature and control input voltage and also of providing a multistage amplification circuit including the power amplifier.

The power amplifier in accordance with the present invention is, to address the problems, characterized in that it includes a first amplification transistor for amplifying an input signal and a first bias circuit for supplying a bias current to the first amplification transistor, wherein:

the first bias circuit includes: a first biasing transistor for supplying the bias current to a base of the first amplification transistor; a control input terminal to which a control input voltage is fed as a control signal for controlling amplification by the first amplification transistor; a VBE-controlled voltage source circuit; and a current mirror circuit, the VBE-controlled voltage source circuit includes: a first resistor provided between the control input terminal and a base of the first biasing transistor; a first transistor having a base connected to the first resistor and to the base of the first biasing transistor; and a second transistor having an emitter grounded, a base connected to an emitter of the first transistor, and a collector connected to the base of the first transistor, and the current mirror circuit includes: a third transistor having an emitter grounded, a base connected to the control input terminal via a second resistor, and a collector connected to the base of the third transistor via a third resistor; and a fourth transistor having an emitter grounded, a base connected to the collector of the third transistor, and a collector connected to the base of the second transistor.

In the arrangement, the power amplifier includes a first bias circuit which includes a first biasing transistor for supplying a bias current to the base of a first amplification transistor. The first bias circuit includes a VBE-controlled voltage source circuit and a current mirror circuit.

The VBE-controlled voltage source circuit includes: a first resistor provided between a control input terminal and the base of the first biasing transistor; a first transistor with its base connected to the first resistor and to the base of the first biasing transistor; and a second transistor with its emitter grounded, its base connected to the emitter of the first transistor, and its collector connected to the base of the first transistor.

The current mirror circuit includes: a third transistor with its emitter grounded, its base connected to the control input terminal via a second resistor, and its collector connected to the base of the third transistor via a third resistor; and a fourth transistor with its emitter grounded, its base connected to the collector of the third transistor, and its collector connected to the base of the second transistor. The fourth transistor operates as a current source for the VBE-controlled voltage source circuit.

The arrangement of the present invention is capable of compensating both the temperature characteristics of the gain of the power amplifier and the control input voltage characteristics of the gain of the power amplifier.

Additional objects, advantages and novel features of the invention will be set forth in part in the description which follows, and in part will become apparent to those skilled in the art upon examination of the following or may be learned by practice of the invention.

DESCRIPTION OF THE EMBODIMENTS

Embodiment 1

Figure 1:
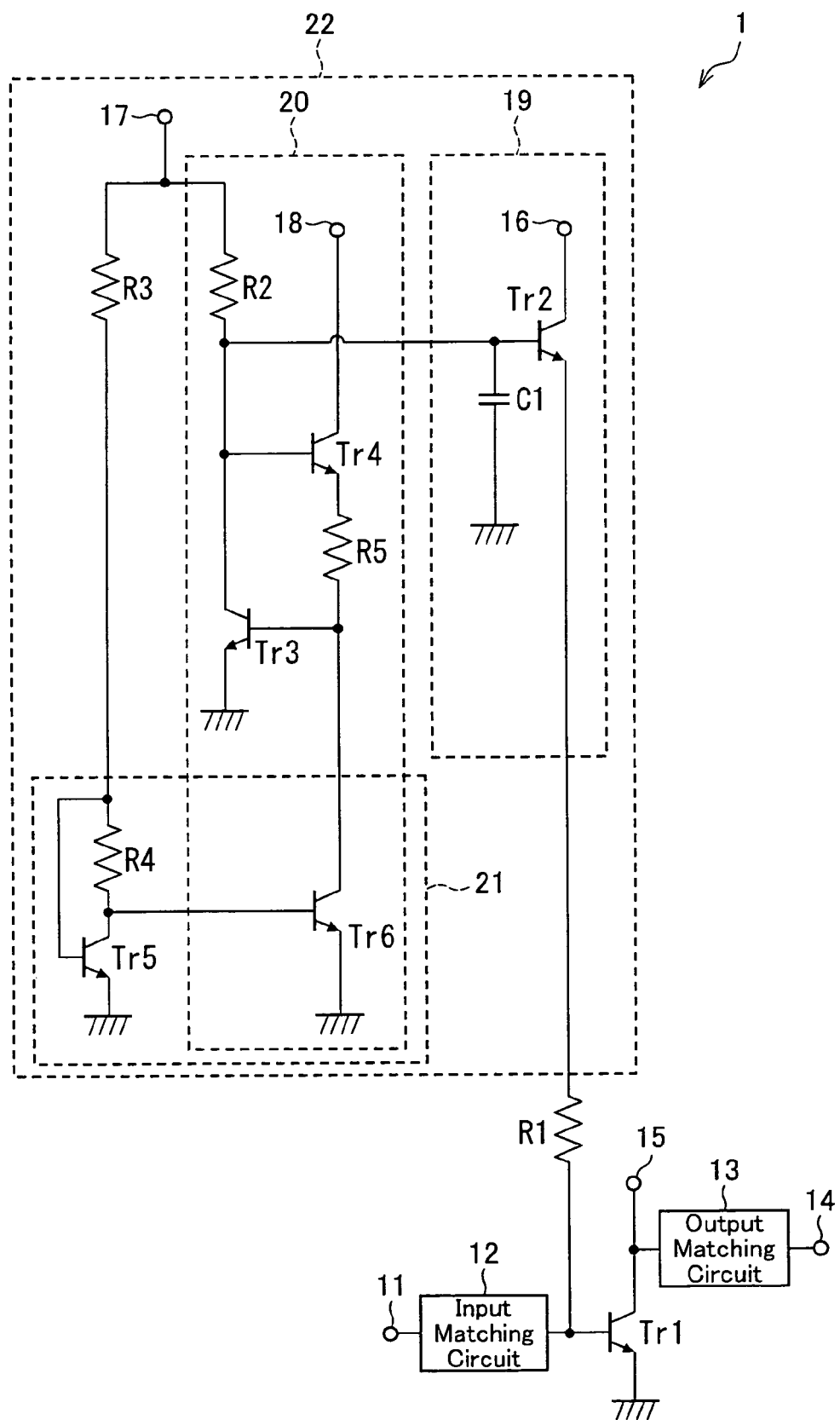
FIG. 1 is a schematic circuit diagram of a power amplifier in accordance with an embodiment of the present invention.

The following will describe an embodiment of the present invention in reference to FIGS. 1 to 17. FIG. 1 is a schematic circuit diagram of a power amplifier of the present embodiment.

As illustrated in FIG. 1, the power amplifier 1 of the present embodiment includes an amplification transistor (first amplification transistor) Tr1, an input matching circuit 12, an output matching circuit 13, a resistor R1, and a bias circuit (first bias circuit) 22. The amplification transistor Tr1 has its base connected to an input signal terminal 11 of the power amplifier 1 via the input matching circuit 12 and its collector connected to an output signal terminal 14 of the power amplifier 1 via the output matching circuit 13. In the power amplifier 1 thus configured, high frequency signals fed at the input signal terminal 11 are past through the input matching circuit 12, amplified by the amplification transistor Tr1, and then past through the output matching circuit 13 for output at the output signal terminal 14.

The base of the amplification transistor Tr1 is connected to the bias circuit 22 via the resistor R1. The collector of the amplification transistor Tr1 is connected to a power supply terminal 15 which supplies a bias voltage to the amplification transistor Tr1. The emitter of the amplification transistor Tr1 is grounded.

The bias circuit 22 supplies a bias current to the amplification transistor Tr1 according to a control input voltage that is fed to the bias circuit 22 as a control signal. The bias circuit 22 also renders the bias current of the power amplifier 1 less susceptible to variations in the control input voltage and reduces variations in the gain of the amplification transistor Tr1 with temperature changes. The bias circuit 22 includes a linear compensation circuit 19, a VBE-controlled voltage source circuit 20, a Nagata current mirror circuit (current mirror circuit) 21, a control input terminal 17, and a resistor (second resistor) R3.

The control input terminal 17 is a terminal at which the control input voltage is fed as the control signal from an external circuit (not shown). The control input voltage turns on/off amplification by the power amplifier 1. The mechanism facilitates designing the external circuit when the power amplifier 1 has low control input voltage dependence, because the control input voltage does not need to be highly precise.

The linear compensation circuit 19 increases the bias current supplied to the base of the amplification transistor Tr1 according to a high frequency signal fed from the input signal terminal 11. The linear compensation circuit 19 includes a transistor (first biasing transistor) Tr2, a capacitor C1, and a power supply terminal 16.

The transistor Tr2 supplies the bias current to the amplification transistor Tr1. The emitter of the transistor Tr2 is connected to the base of the amplification transistor Tr1 via the resistor R1. The resistor R1 is a stabilization resistor (ballast resistor) for the prevention of thermal-runaway of the amplification transistor Tr1. The power supply terminal 16 is connected to the collector of the transistor Tr2 to supply a bias voltage to the transistor Tr2. In this configuration, the base voltage of the transistor Tr2 is approximately equal to the sum of the VBE of the amplification transistor Tr1 and the VBE of the transistor Tr2, that is, about twice the VBE, if the voltage drop across the resistor R1 is disregarded.

The base of the transistor Tr2 is grounded via the capacitor C1 and connected to the VBE-controlled voltage source circuit 20. The capacitor C1 is provided to effectively apply some of incoming high frequency signals across the emitter/base of the transistor Tr2 by (practically) grounding the base of the transistor Tr2 for high frequency signals. The application of some high frequency signals across the emitter/base of the transistor Tr2 produces a direct current according to the amplitudes of the high frequency signals, flowing from the emitter of the transistor Tr2 to the base of the amplification transistor Tr1. The high frequency signals, if applied to the VBE-controlled voltage source circuit 20 or the Nagata current mirror circuit 21, could impair the functions of the circuit; the capacitor C1 prevents such an event from happening.

The VBE-controlled voltage source circuit 20 feeds a voltage to the base of the transistor Tr2 and includes transistors Tr3, Tr4 and resistors R2, R5. The VBE-controlled voltage source circuit 20 also includes a transistor (fourth transistor) Tr6. The transistor Tr6 is a component of the Nagata current mirror circuit 21 (detailed later) and acts as a current source for the VBE-controlled voltage source circuit 20. The transistor Tr6 will be described later in detail.

The transistors Tr3, Tr4 are cascaded: the collector of the transistor (second transistor) Tr3 is connected to the base of the transistor (first transistor) Tr4. These terminals are connected to the control input terminal 17 via the resistor (first resistor) R2. To the control input terminal 17 is fed a control input voltage as a control signal from an external circuit. The base of the transistor Tr3 is connected to the emitter of the transistor Tr4 via the resistor (fourth resistor) R5. A power supply terminal 18 is connected to the collector of the transistor Tr4 to supply a bias voltage to the transistor Tr4.

In this configuration, the collector voltage of the transistor Tr3 is approximately equal to the sum of the VBE of the transistor Tr3 and the VBE of the transistor Tr4, that is, about twice the VBE, if the voltage drop across the resistor R5 is disregarded. This collector voltage of the transistor Tr3 is fed to the base of the transistor Tr2 as the output voltage of the VBE-controlled voltage source circuit 20. Put differently, the voltage needed by the base of the transistor Tr2 as its bias voltage is fed as the output voltage of the VBE-controlled voltage source circuit 20. The provision of the resistor R2 in the VBE-controlled voltage source circuit 20 enables the VBE-controlled voltage source circuit 20 to produce an output voltage about twice the VBE as discussed above. The resistor R5 amplifies an increase in the collector current of the transistor Tr6 (detailed later) so that the resultant amplified voltage increase can produce an increase in the gain of the power amplifier 1.

The Nagata current mirror circuit 21 includes transistors Tr5, Tr6 and a resistor (third resistor) R4.

The collector of the transistor Tr6 is connected to the base of the transistor Tr3 and to the emitter of the transistor Tr4 via the resistor R5 and acts as a current source for the VBE-controlled voltage source circuit 20. The emitter of the transistor Tr6 is grounded.

The collector and base of the transistor (third transistor) Tr5 are connected to each other via the resistor R4. The base of the transistor Tr6 is connected to a point between the collector of the transistor Tr5 and the resistor R4. The emitter of the transistor Tr5 is grounded. Since the base of the transistor Tr5 is connected to the control input terminal 17 via the resistor R3, a control input voltage is fed from an external circuit to the base of the transistor Tr5. The resistor R3, in combination with the transistor Tr5, produces a reference current according to the control input voltage fed from the control input terminal 17.

The resistors R2, R3 are both connected to the control input terminal 17. The resistors R2, R3 are connected to power supply terminals delivering equal voltage changes because that configuration of the power amplifier 1 provides compensation voltage dependence attributable to the power supply terminals (control input voltage dependence for the control input terminal 17). The resistors R2, R3 are connected to the control input terminal 17; this is not the only possibility. The resistors R2, R3 only need to be connected to power supply terminals delivering equal voltage changes. In other words, the resistors R2, R3 may be connected to control input terminals (a first control input terminal and a second control input terminal) which in turn are connected to external circuits delivering equal voltages.

Unlike ordinary current mirror circuits, in the Nagata current mirror circuit 21, if the control input voltage is increased, the collector current of the transistor Tr5 is increased, making the base voltage of the transistor Tr6 lower than the base voltage of the transistor Tr5 by an amount equal to the voltage drop across the resistor R4. Accordingly, the collector current of the transistor Tr6 is a duplicate smaller than the collector current of the transistor Tr5. Put differently, the collector current of the transistor Tr6 (mirror current) is very small.

Furthermore, in the Nagata current mirror circuit 21, if the collector current of the transistor Tr5 is further increased, the collector current of the transistor Tr6 first reaches a peak value and then falls. This peak-related behavior cannot be found with other current mirror circuits which produce very small current mirror current, such as Widlar current mirror circuits.

An increase in the control input voltage results in an increase in the reference current produced by the resistor R3 and the transistor Tr5. However, the transistor Tr6, as a current source for the VBE-controlled voltage source circuit 20, reduces its collector current.

The collector current of the transistor Tr6 increases with temperature rise as with an ordinary current mirror circuit.

In the Nagata current mirror circuit 21 in the power amplifier 1 of the present embodiment, the transistor Tr6 produces a mirror current in synchronism with the VBE-controlled voltage source circuit 20 from the reference current produced according to the varying control input voltages by the resistor R3 and the transistor Tr5. The power amplifier 1 utilizes the aforementioned post-peak behavior of the Nagata current mirror circuit 21. Thus, the transistor Tr6 is capable of controlling the emitter current to the transistor Tr4. That restrains the VBE-controlled voltage source circuit 20 from producing too low an output voltage when temperature rises. The configuration thus compensates the temperature characteristic of the gain of the power amplifier 1 and restrains the temperature dependence of the gain of the power amplifier 1.

Similarly to the VBE-controlled voltage source circuit 20 delivering its output voltage to the biasing transistor according to the control input voltage fed from the control input terminal 17, the Nagata current mirror circuit 21 also produces an output current according to the control input voltage. In other words, it is the control input terminal 17 that provides both the VBE-controlled voltage source circuit 20 and the Nagata current mirror circuit 21 with the control input voltage. The configuration compensates the control input voltage characteristics of the gain of the power amplifier 1 and restrains the control input voltage dependence of the power amplifier 1.

Accordingly, the power amplifier 1 compensates both the temperature characteristics of the gain of the power amplifier and the control input voltage characteristics of the gain of the power amplifier.

Figure 24:
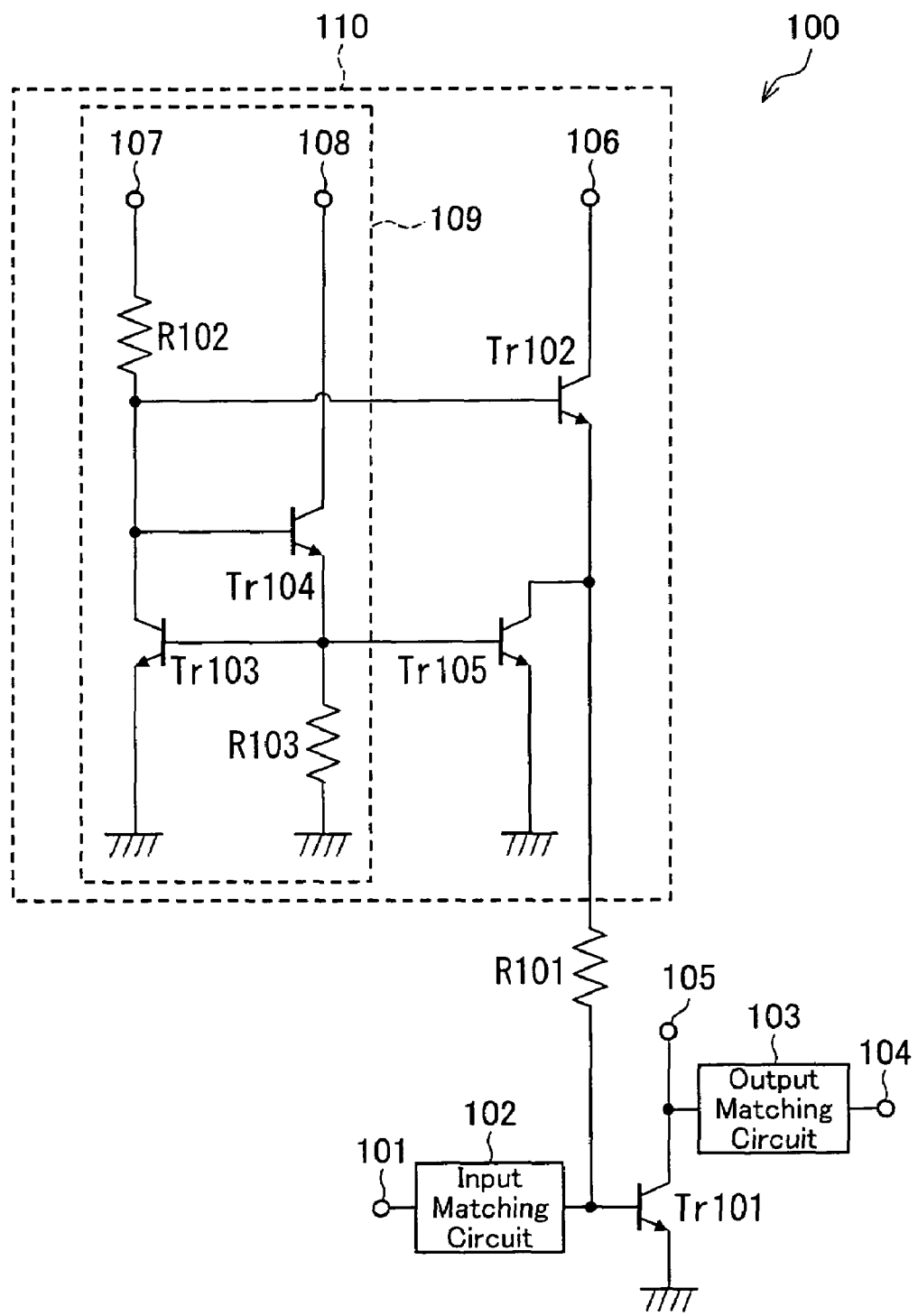
FIG. 24 is a schematic circuit diagram of a conventional power amplifier.

The power amplifier 1 of the present embodiment differs from the power amplifier 100 in circuit structure: the resistor R103 in the power amplifier 100 shown in FIG. 24 is replaced with the Nagata current mirror circuit (current source circuit) 21 that is connected to the control input terminal 17. Another difference lies where the resistor R5 is connected to the emitter of the transistor Tr4.

Figure 2:
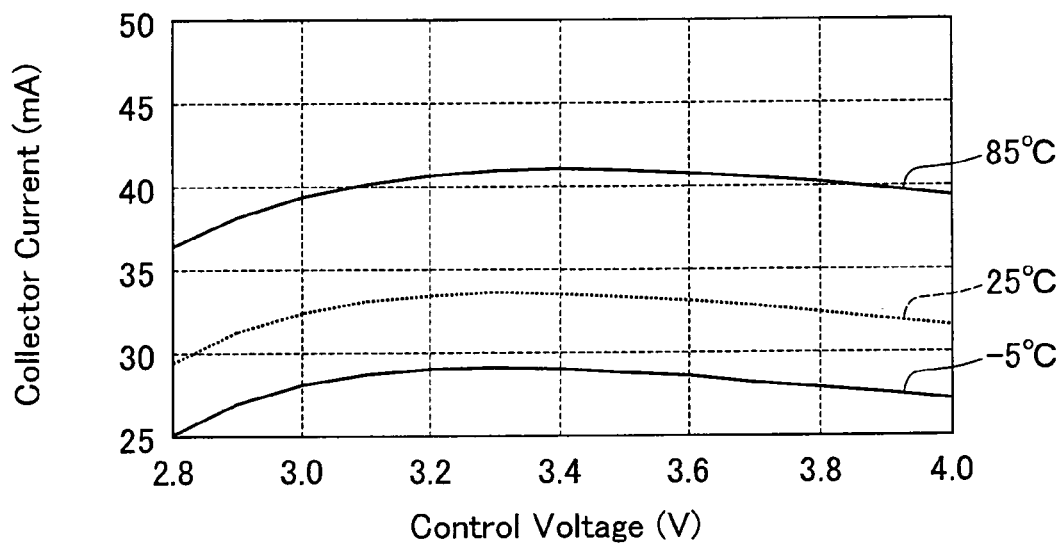
FIG. 2 is a graph representing the control input voltage dependence of the collector current of an amplification transistor in the power amplifier shown in FIG. 1.
Figure 3:
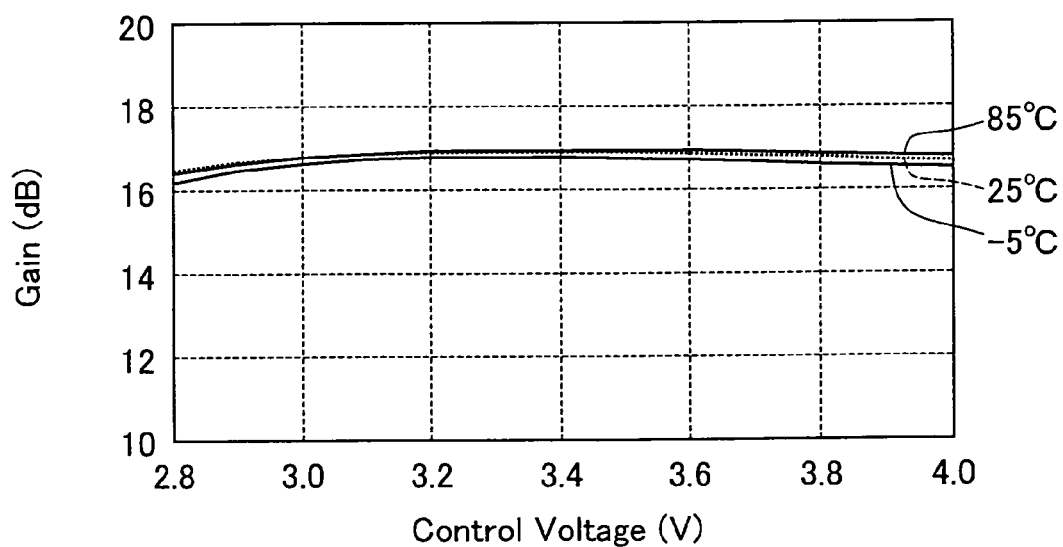
FIG. 3 is a graph representing the control input voltage dependence of the gain of the power amplifier shown in FIG. 1.

Next will be discussed the control input voltage dependence of the collector current of the amplification transistor Tr1 in the power amplifier 1 and the control input voltage dependence of the gain of the power amplifier 1. FIG. 2 is a graph representing the control input voltage dependence of the collector current of the amplification transistor Tr1. FIG. 3 is a graph representing the control input voltage dependence of the gain of the power amplifier 1.

Figure 4:
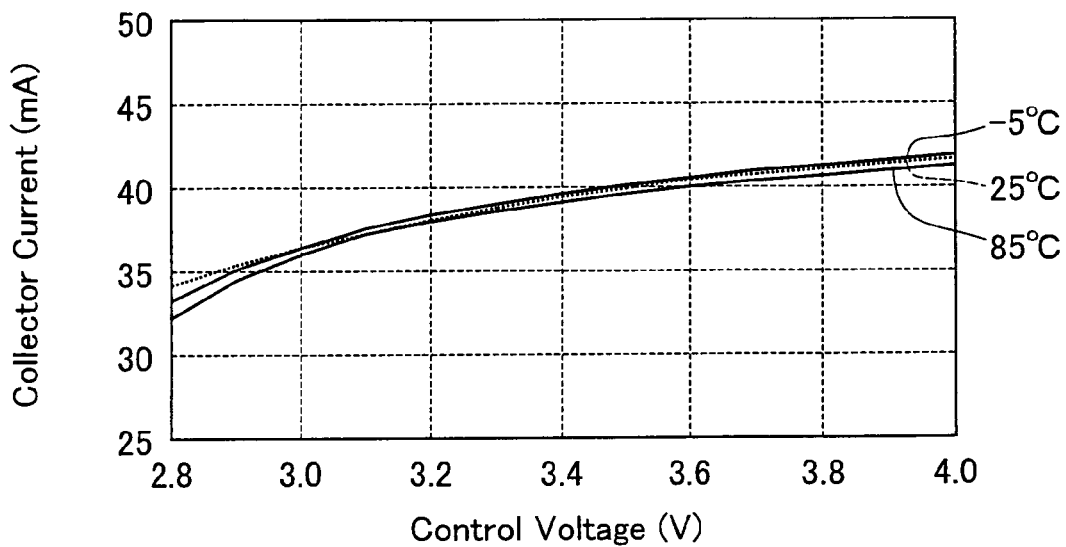
FIG. 4 is a graph representing the control input voltage dependence of the collector current of an amplification transistor in a conventional power amplifier shown in FIG. 24.
Figure 5:
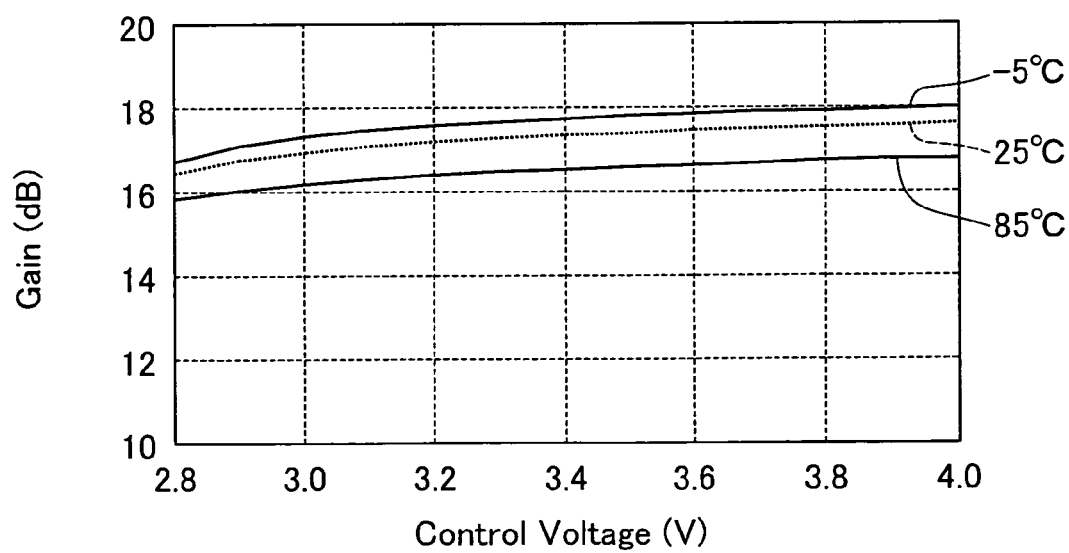
FIG. 5 is a graph representing the control input voltage dependence of the gain of the conventional power amplifier shown in FIG. 24.

For a comparison of the characteristics of the power amplifier 1 shown in FIGS. 2 and 3 to the characteristics of conventional art, FIG. 4 is a graph representing the control input voltage dependence of the collector current of the amplification transistor Tr101, and FIG. 5 is a graph representing the control input voltage dependence of the gain of the power amplifier 100, both in the power amplifier 100.

FIGS. 2 to 5 show results of simulation of the control input voltage dependence at −5° C., 25° C., and 85° C. FIG. 3 assumed, in plotting the gain of the power amplifier 1, that the power amplifier 1 was operating at 2 GHz. Also in FIG. 3, maximum stable gains (dB) were plotted to remove effects of the input matching circuit 12 and the output matching circuit 13. Similarly to FIG. 3, FIG. 5 assumed, in plotting the gain of the power amplifier 100, that the power amplifier 100 was operating at 2 GHz. Also in FIG. 5, maximum stable gains (dB) were plotted to remove effects of the input matching circuit 12 and the output matching circuit 13.

FIGS. 2 and 3 assumed in the simulation that the resistor R1 was 100Ω, the resistor R2 was 1 kΩ, the resistor R3 was 4 kΩ, the resistor R4 was 120Ω, and the resistor R5 was 400Ω, all disposed in the power amplifier 1 shown in FIG. 1. FIGS. 2 and 3 further assumed a transistor size (emitter size), expressed in ratios relative to the transistor Tr3, of 1.5 for the transistor Tr2, 1 for the transistor Tr4, 0.5 for the transistor Tr5, and 1 for the transistor Tr6, all again disposed in the power amplifier 1 shown in FIG. 1. FIGS. 4 and 5 assumed in the simulation that the components of the power amplifier 100 shown in FIG. 24 had the same property values as their equivalents in the power amplifier 1 shown in FIG. 1: namely, the resistor R101 was assumed to be 100Ω, and the resistor R102 was assumed to be 1 kΩ. The resistor R103 was assumed to be 500Ω. Furthermore, the transistor Tr103 was assumed to have the same structure as the transistor Tr3. The transistor Tr105 was assumed to have the same emitter size as the transistor Tr3.

FIG. 4 demonstrates that in the power amplifier 100, the collector current of the amplification transistor Tr101 varies little with a rise in temperature. If anything, at high control input voltages, the collector current of the amplification transistor Tr101 decreases with a rise in temperature. FIG. 4 demonstrates also that the collector current of the amplification transistor Tr1 increases with an increase in the control input voltage if the temperature remains constant. In contrast, FIG. 2 demonstrates that in the power amplifier 1 shown in FIG. 1, the collector current of the amplification transistor Tr1 increases greatly with a rise in temperature. FIG. 2 demonstrates also that if temperature remains constant, the collector current of the amplification transistor Tr1 increases with an increase in the control input voltage, but far less so than in the power amplifier 100.

Referring to FIG. 5, the gain of the power amplifier 100 increases with an increase in the control input voltage and decreases with a rise in temperature. In contrast, the gain of the power amplifier 1 varies with a rise in temperature in a limited manner as depicted in FIG. 3. A comparison of FIGS. 2 and 4 would reveal that this is attributable to the increase in the collector current of the amplification transistor Tr1 with increasing temperature. Furthermore, the gain of the power amplifier 1 varies in a more limited manner with increasing control input voltage than in the power amplifier 100. The limited variance of the gain is attributable to the limited variance of the collector current of the amplification transistor Tr1 with increasing control input voltage.

Therefore, the power amplifier 1 of the present embodiment includes not only the Nagata current mirror circuit 21, as well as the VBE-controlled voltage source circuit 20. In this configuration, the gain varies only in a limited manner with changes in temperature and control input voltage as mentioned earlier. In addition, since the power amplifier 1 allows only limited gain variations with control input voltage change, the control input voltage produced by an external circuit does not need to be highly precise. The mechanism facilitates designing the external circuit connected to the control input terminal 17 of the power amplifier 1.

As described earlier, FIG. 3 demonstrates that the gain of the power amplifier 1 does not change with temperature for the reasons detailed in the following. Line 601 in FIG. 6 indicates the temperature dependence of a current flow through the resistor R103 in the power amplifier 100 shown in FIG. 24. Line 701 in FIG. 7 indicates the control input voltage dependence of that current flow through the resistor R103 in the power amplifier 100.

Figure 6:
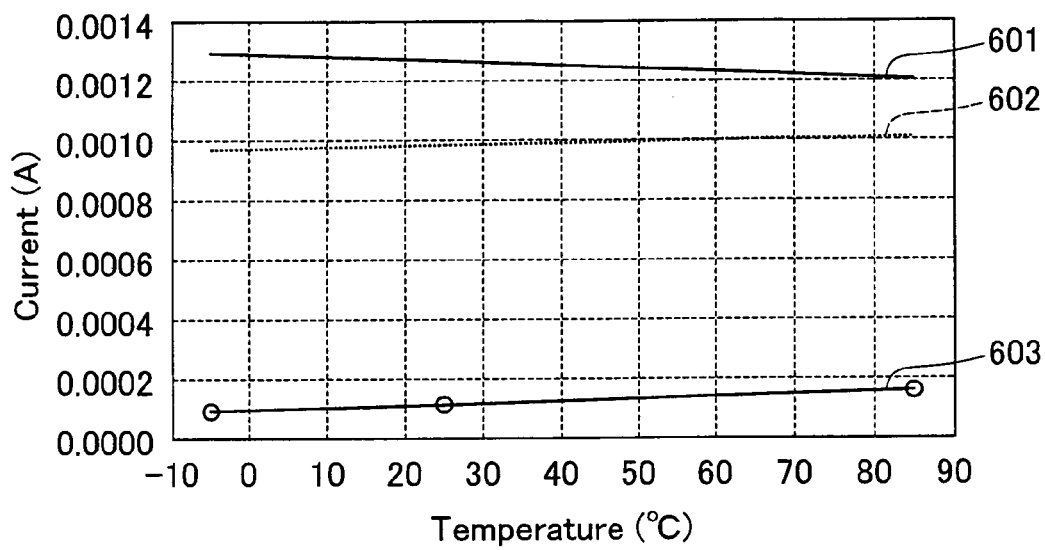
FIG. 6 is a graph representing the temperature dependence of: a current flow through a resistor R103 in the conventional power amplifier shown in FIG. 24; the collector current of a transistor Tr106 in a power amplifier shown in FIG. 8; and the collector current of a transistor Tr6 in the power amplifier shown in FIG. 1.

The current flow through the resistor R103 decreases with rising temperature as indicated by line 601 in FIG. 6. The current flow through the resistor R103, although hardly dependent on the control input voltage, increases slightly with increase in the control input voltage as indicated by line 701 in FIG. 7.

The current flow through the resistor R103, which is almost equal to the emitter current of the transistor Tr104, reduces the VBE of the transistor Tr104 with temperature rise and increases that VBE with control input voltage rise. As mentioned earlier, in the power amplifier 100, the sum of the VBE of the transistor Tr103 and the VBE of the transistor Tr104 is fed as the base voltage of the transistor Tr102. Therefore, it would be understood that in the power amplifier 100, if the base voltage of the transistor Tr102 increases, the base current of the amplification transistor Tr101 increases, and the gain of the power amplifier 100 also increases. Consequently, the gain of the power amplifier 100 decreases with temperature rise as depicted in FIG. 5, because of the change in the current flow through the resistor R103 with temperature. The gain of the power amplifier 100 increases with increase in the control input voltage, because of the change in the current flow through the resistor R103 with the control input voltage.

If the collector current is not allowed to change with a rise in the ambient temperature of a transistor, the gain of the amplification circuit (e.g. power amplifier 100) decreases because the amplification property of the transistor deteriorates with temperature rise. In the power amplifier 100, the temperature dependence of the collector current is relatively low as depicted in FIG. 4. Therefore, the gain of the power amplifier 100 decrease with temperature rise as depicted in FIG. 5. The power amplifier 100 could be adapted so that the collector current of the amplification transistor Tr101 increases with temperature rise. It is possible to adapt the power amplifier 100 to increase the collector current of the amplification transistor Tr101 caused by temperature rise. It is however difficult to adapt the amplification transistor Tr101 so that the power amplifier 100 can compensate for deterioration of the amplification property of the amplification transistor Tr101 caused by temperature rise.

Generally, in order to restrain the degradation of amplification properties of a transistor with rising temperature, the collector current of the transistor needs to be increased significantly. In the power amplifier 1 of the present embodiment, the collector current of the amplification transistor Tr1 increases greatly with temperature rise as depicted in FIG. 2. This enables the power amplifier 1 to restrain gain variations with rising temperature as depicted in FIG. 3.

As described earlier, the decrease in the gain of the amplification circuit with rising temperature is attributable to the collector current of the amplification transistor in the amplification circuit. In view of this fact, the inventors have paid attention to, as a way to increase the collector current of the amplification transistor with rising temperature, the replacing of the resistor R103 which behaves like a current source (that is, the current through the resistor R103 does not change much with the control input voltage) with a current source which increases its current output with rising temperature. In other words, the inventors have come to a conclusion that the decrease in the gain of the amplification circuit with rising temperature can be restrained by replacing the resistor R103 with a current source which has an opposite temperature characteristic from the resistor R103.

Figure 8:
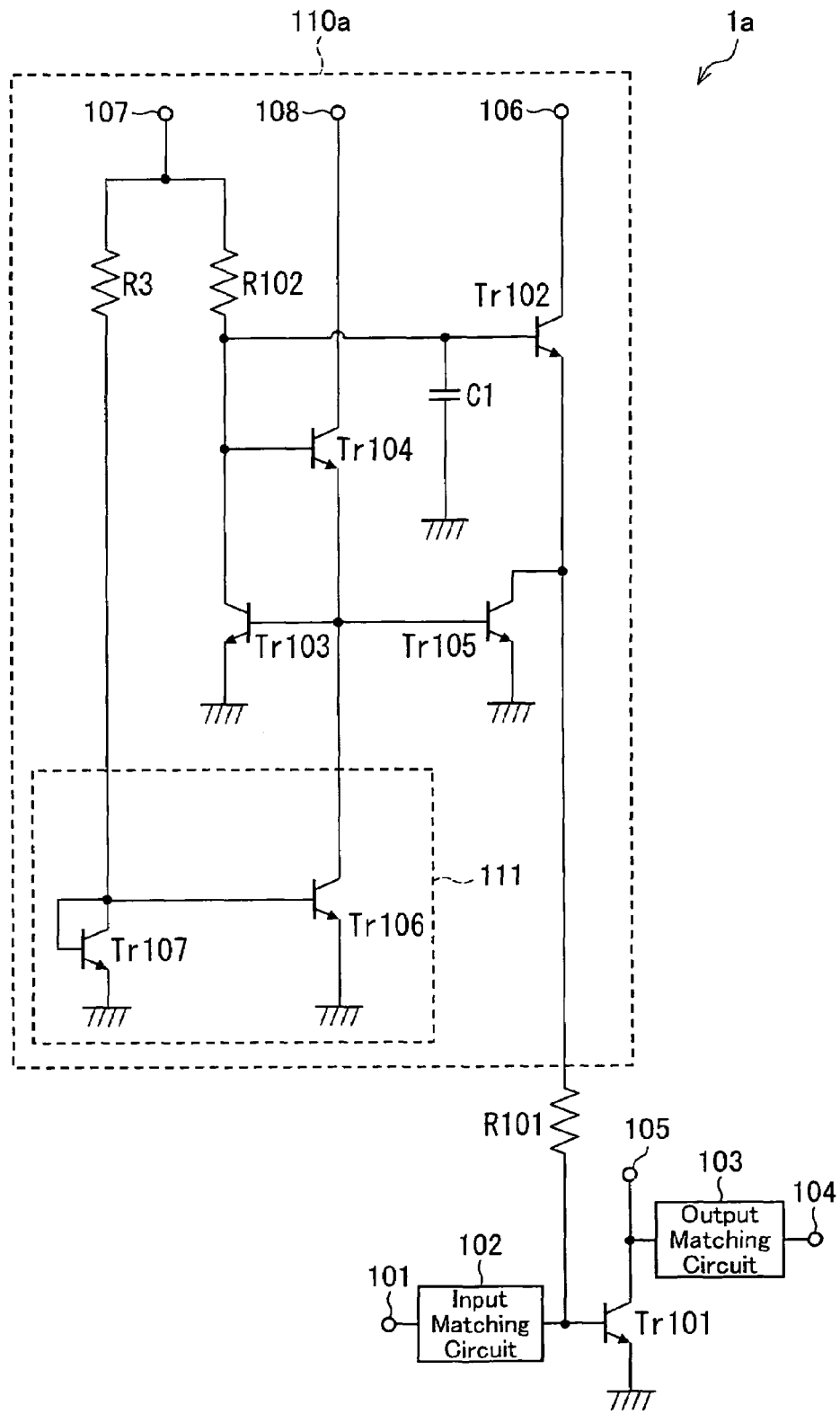
FIG. 8 is a schematic circuit diagram of a power amplifier including a current mirror circuit.

FIG. 8 is a schematic circuit diagram of a power amplifier including a current mirror circuit 111. As illustrated in FIG. 8, a power amplifier 1a differs from the power amplifier 100 in that the resistor R103 is replaced by the current mirror circuit 111 which has an opposite temperature characteristic from the resistor R103 and also that the power amplifier la includes a resistor R3 and a capacitor C1. Those members which have the same functions as members of the power amplifier 100 or 1 are indicated by the same reference numerals and description thereof is omitted.

The current mirror circuit 111 in a bias circuit 110a includes transistors Tr106, Tr107. The transistor Tr106 has its emitter grounded and its collector connected to the base of the transistor Tr103 and to the emitter of the transistor Tr104. The transistor Tr107 has its emitter grounded and its collector and base connected to the base of the transistor Tr106. The base of the transistor Tr107 is connected to the control input terminal 107 via the resistor R3. A control input voltage (control signal from an external circuit) is fed at the base of the transistor Tr107.

Here, line 602 in FIG. 6 indicates the temperature dependence of the collector current of the transistor Tr106. Line 702 in FIG. 7 indicates the control input voltage dependence of the collector current of the transistor Tr106.

Figure 7:
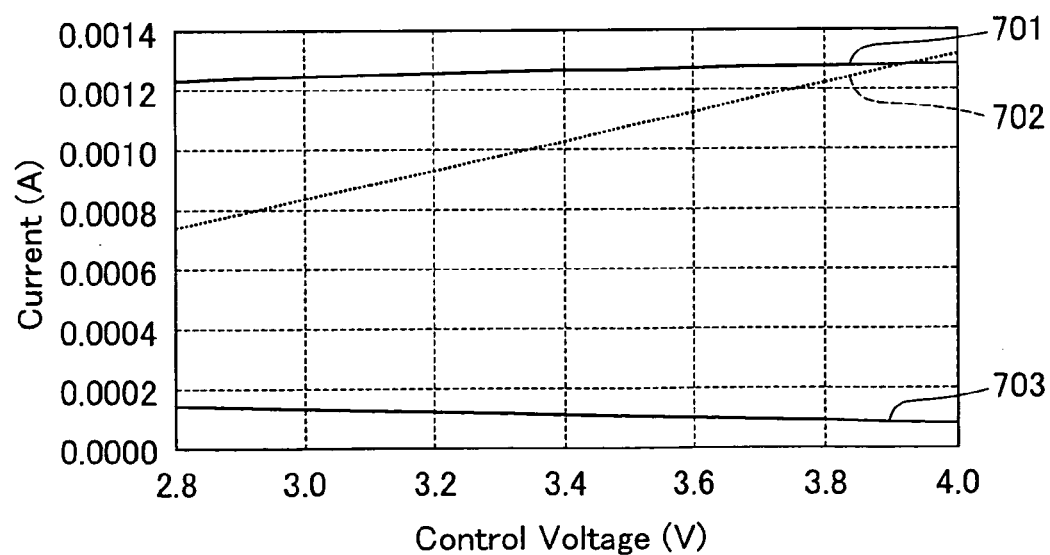
FIG. 7 is a graph representing the control input voltage dependence of: a current flow through the resistor R103 in the power amplifier shown in FIG. 24; the collector current of the transistor Tr106 in the power amplifier shown in FIG. 8; and the collector current of the transistor Tr6 in the power amplifier shown in FIG. 1.

Line 602 in FIG. 6 indicates that the collector current of the transistor Tr106 increases with temperature rise. This is attributable to the facts that the reference current produced by the resistor R3 and the transistor Tr107 increases with temperature rise according to the control input voltage fed to the control input terminal 107 and also that the collector current of the transistor Tr106 is a duplicate of the reference current produced by the current mirror circuit 111. FIG. 7 line 702 however indicates that the collector current of the transistor Tr106 increases greatly with a rising control input voltage fed to the control input terminal 107.

Figure 9:
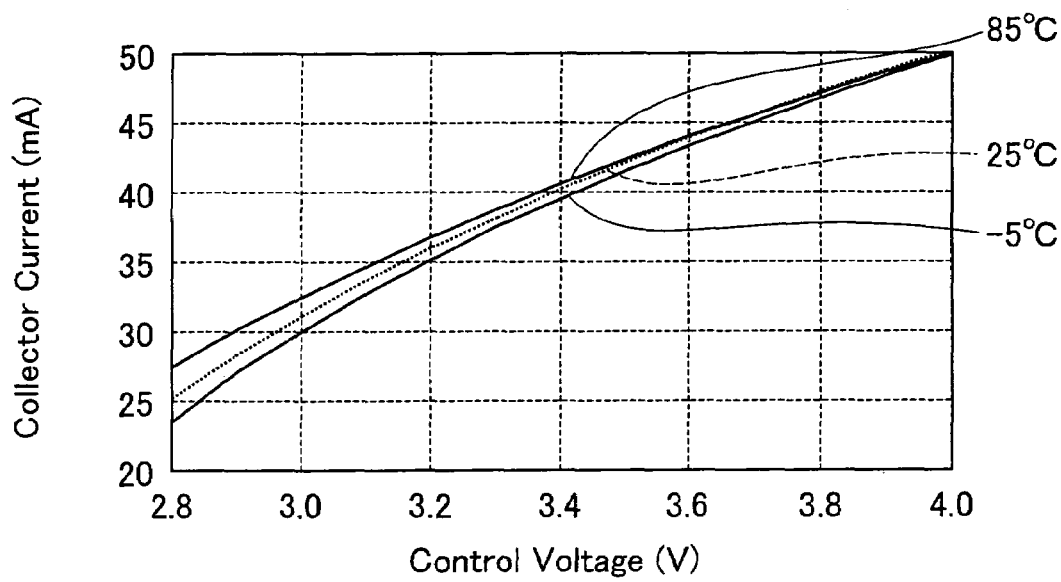
FIG. 9 is a graph representing the control input voltage dependence of the collector current of an amplification transistor in the power amplifier shown in FIG. 8.
Figure 10:
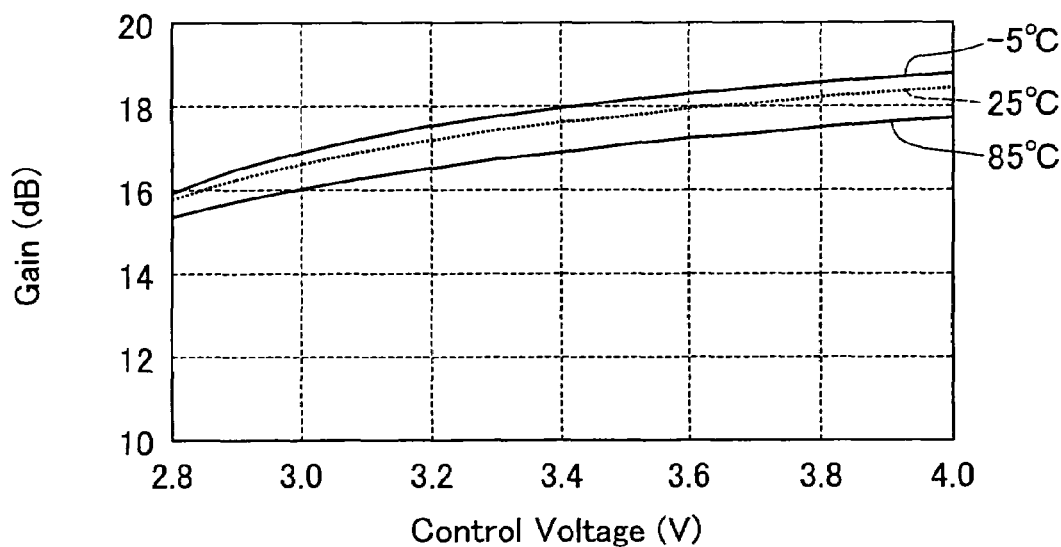
FIG. 10 is a graph representing the control input voltage dependence of the gain of the power amplifier shown in FIG. 8.

Next will be discussed the control input voltage dependence of the collector current of the amplification transistor Tr101 in the power amplifier la and the control input voltage dependence of the gain of the power amplifier 1a. FIG. 9 is a graph representing the control input voltage dependence of the collector current of the amplification transistor Tr101. FIG. 10 is a graph representing the control input voltage dependence of the gain of the power amplifier 1a.

Each component of the power amplifier 1a has the same property values as its equivalent in the power amplifier 100 or the power amplifier 1. Both the transistors Tr106, Tr107 have the same emitter size as the transistor Tr3. FIGS. 9 and 10 show results of simulation of the control input voltage dependence at −5° C., 25° C., and 85° C. FIG. 10 assumed, in plotting the gain of the power amplifier 1a, that power amplifier 1a was operating at 2 GHz. Also in FIG. 10, maximum stable gains (dB) were plotted to remove effects of the input matching circuit 102 and the output matching circuit 103.

Similarly to FIG. 4, FIG. 9 demonstrates that the collector current of the amplification transistor Tr101 increases by limited amounts with temperature rise and that the collector current of the amplification transistor Tr101 increases with the control input voltage. FIG. 10 demonstrates that the gain of the power amplifier 1a decreases with temperature rise and increase with increase in the control input voltage.

Therefore, it would be understood that the gain of the power amplifier la varies depending on both temperature and the control input voltage as in the power amplifier 100, despite that the resistor R103 is replaced by the current mirror circuit 111.

Figure 11:
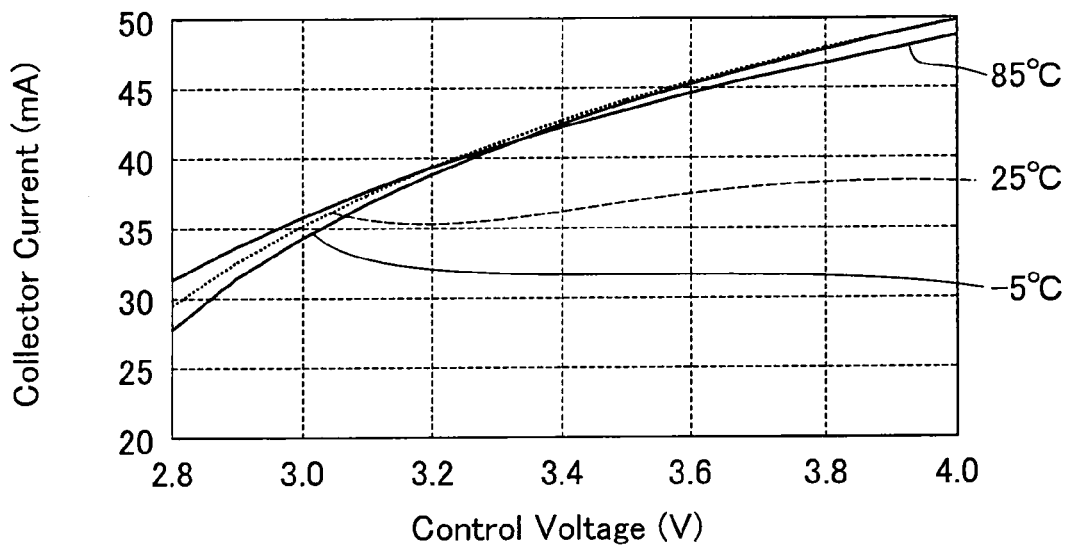
FIG. 11 is a graph representing the control input voltage dependence of the collector current of an amplification transistor in the conventional power amplifier shown in FIG. 24 with the transistor Tr105 being removed.
Figure 12:
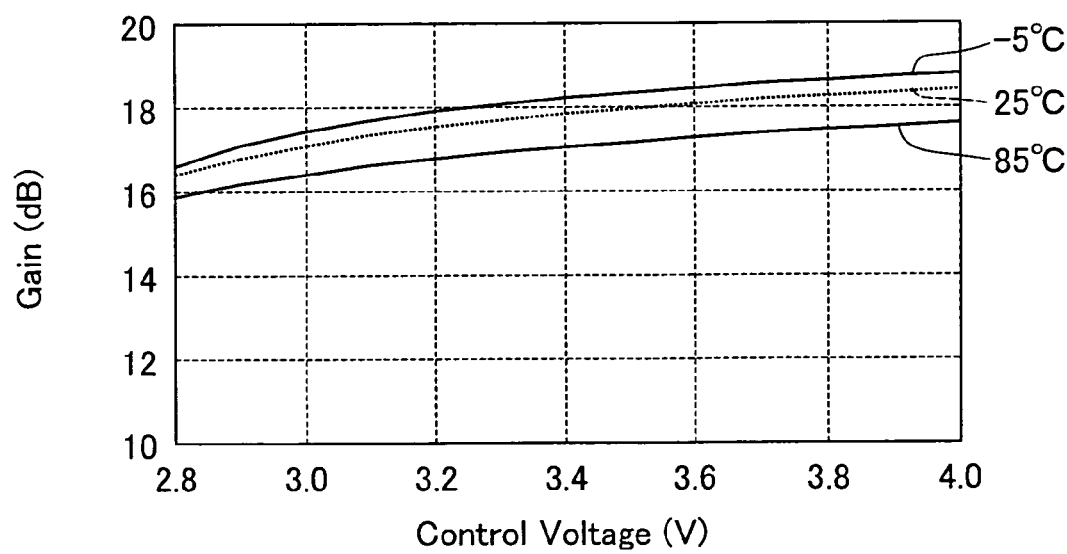
FIG. 12 is a graph representing the control input voltage dependence of the gain of the conventional power amplifier shown in FIG. 24 with the transistor Tr105 being removed.

FIG. 11 shows the control input voltage dependence of the collector current of the amplification transistor Tr101 in the power amplifier 100 when no transistor Tr105 is provided. FIG. 12 shows the control input voltage dependence of the gain of the power amplifier 100 when no transistor Tr105 is provided in the power amplifier 100.

A comparison of FIG. 4 to FIG. 11 and FIG. 5 to FIG. 12 reveals that the transistor Tr105 of the power amplifier 100 restrains the control input voltage dependence of the collector current of the amplification transistor Tr101 in the power amplifier 100 and of the gain of the power amplifier 100. Put differently, the provision of the transistor Tr105 restrains the control input voltage dependence in the power amplifier 100.

The transistor Tr105, provided with the power amplifier 1a, may not appear to be functioning properly to sufficiently restrain the control input voltage dependence of the collector current of the amplification transistor Tr101 in the power amplifier 1a and of the gain of the power amplifier 1a.

In fact, the transistor Tr105 is restraining the control input voltage dependence of the collector current of the amplification transistor Tr101 in the power amplifier 1a and of the gain of the power amplifier 1a. Nevertheless, the control input voltage dependence due to the use of the current mirror circuit 111 made up of the transistors Tr106 and Tr107 outweighs the capability of the transistor Tr105; the control input voltage dependence cannot be eliminated completely by the transistor Tr105.

On the other hand, the collector current of the amplification transistor Tr101 increases to some extent with temperature rise. The collector current changes in such a direction that the gain of the amplification transistor Tr101 increases at high temperatures. However, the effect of the transistor Tr105 on the temperature characteristics of the amplification transistor Tr101 is marginal. The control input voltage dependence of the gain of the amplification transistor Tr101 increases seriously and becomes evident in the power amplifier la before the gain of the amplification transistor Tr101 is compensated.

Therefore, the current source used in place of the resistor R103 needs to have an opposite temperature characteristic to the current flow through the resistor R103 and limited control input voltage dependence. If and only if these conditions are fulfilled, both the control input voltage dependence and the temperature dependence of the gain of the power amplifier are restrained. To restrain both the dependence, the power amplifier 1 of the present embodiment is provided with the Nagata current mirror circuit 21.

Line 603 in FIG. 6 indicates the temperature dependence of the collector current of the transistor Tr6 in the power amplifier 1 of the present embodiment. Line 703 of FIG. 7 indicates the control input voltage dependence of the collector current of the transistor Tr6.

Line 603 in FIG. 6 indicates that the collector current of the transistor Tr6 increases with temperature rise. This is attributable to the Nagata current mirror circuit 21 having an opposite temperature characteristic to the resistor R103. Line 703 in FIG. 7 indicates that unlike in the power amplifier 1a, the collector current of the transistor Tr6 decreases with increase in the control input voltage. In other words, the collector current of the transistor Tr6 in the power amplifier 1 exhibits not only an opposite temperature dependence, but also opposite control input voltage dependence, to its equivalent in the power amplifier 100. That enables the power amplifier 1 to restrain increase in the gain of the power amplifier 1 even with increase in the control input voltage as depicted in FIG. 3.

FIG. 3 demonstrates that the gain of the power amplifier 1 reaches a peak value and then slightly decreases with a increasing control input voltage. As described earlier, the transistor Tr105 of the power amplifier 100 shown in FIG. 24 restrains increase in the gain of the power amplifier 100 with increase in the control input voltage fed to the power amplifier 100. Therefore, the power amplifier 1 needs to include no equivalent to the transistor Tr105 in the power amplifier 100, in order to prevent excessive decrease in the gain with increase in the control input voltage. This is however not the only possibility: the power amplifier may include an equivalent to the transistor Tr105 for adjustment of the power amplifier 1.

The collector current of the transistor Tr6 has an opposite temperature characteristic to its equivalent in the power amplifier 100 as indicated by line 603 in FIG. 6. Specifically, the collector current of the transistor Tr6 increases with temperature rise. The increases are, however, small. Therefore, the power amplifier 1 includes the resistor R5 as illustrated in FIG. 1; the resistor R5 amplifies an increase in the collector current of the transistor Tr5 so that the resultant amplified voltage increase can produce an increase in the gain of the power amplifier 1. The configuration better prevents decrease in the gain of the power amplifier 1 with temperature rise.

The power amplifier 1 includes the resistor R5 so that an increase in the collector current of the transistor Tr6 can lead to an increase in the gain of the power amplifier 1. This is however not the only possibility: for example, the power amplifier 1 may include no resistor R5. When that is the case, the emitter of the transistor Tr4 is connected directly to the base of the transistor Tr3 and to the collector of the transistor Tr6. In a power amplifier with no resistor R5, to change the VBE of the transistor Tr4 and achieve similar effects to the power amplifier 1 (which includes the resistor R5), the changes in the collector current of the transistor Tr6 need to be increased. To this end, the size of the transistor Tr6 in the power amplifier with no resistor R5 is 16 times that of the transistor Tr6 in the power amplifier 1, as an example.

Figure 13:
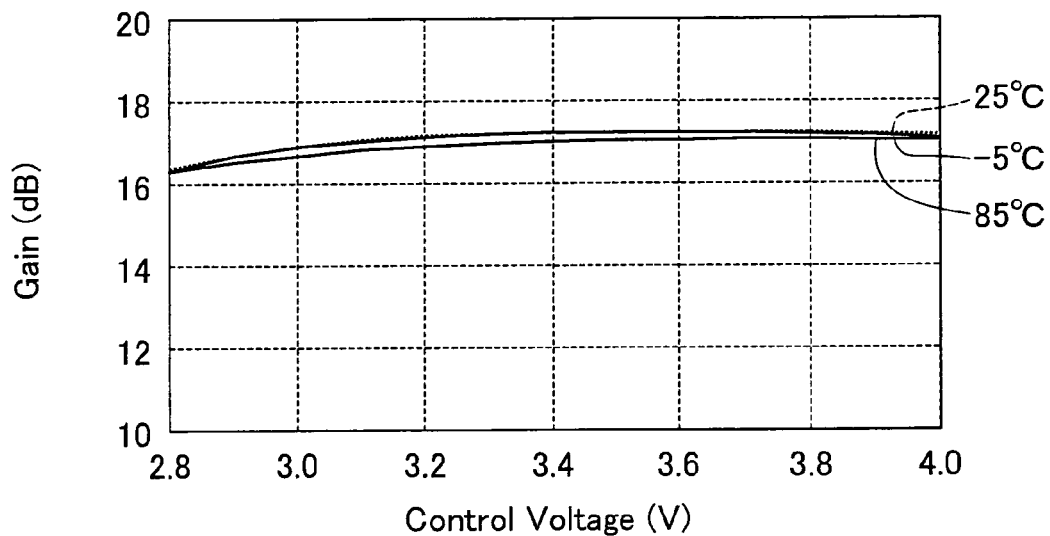
FIG. 13 is a graph representing the control input voltage dependence of the gain of the power amplifier shown in FIG. 1 with the resistor R5 being removed.

FIG. 13 is a graph representing the control input voltage dependence of the gain of the power amplifier that includes no resistor R5 and a transistor Tr6 of a size 16 times that of the transistor Tr6 in the power amplifier 1 shown in FIG. 1. FIG. 13 demonstrates that the gain variations of the power amplifier is not dependent on temperature changes or control input voltage changes similarly to the power amplifier 1 shown in FIG. 1. In the power amplifier, the resistor R4 was 160Ω to adjust temperature characteristics. The components other than the resistor R4 were assumed to have the same property values as those used in the simulation of the power amplifier 1 for FIGS. 2 and 3.

The power supply terminals 16, 18 are provided separately. They may be replaced with a single, common power supply terminal or with the same power supply terminal as the control input terminal 17. These configurations are feasible because the power supply terminals 16, 18 act to feed the collectors of the transistors Tr2, Tr4 with a bias voltage which, even if it varies, could hardly affect characteristics.

As described in the foregoing, the power amplifier 1 of the present embodiment 1 includes the Nagata current mirror circuit 21, as well as the VBE-controlled voltage source circuit 20. The inclusion enables restraining the temperature dependence and control input voltage dependence of the gain of the power amplifier 1.

The power amplifier 1 may be adapted for reduced power consumption. For example, the power amplifier 1 does not need to include a transistor equivalent to the transistor Tr105 of the power amplifier 100 as described earlier. That means the transistor equivalent to the transistor Tr105 of the power amplifier 100 can be removed from the power amplifier 1, which eliminates the current flow through the transistor. The power amplifier 1, fitted with the resistor R5, is capable of converting small changes in the collector current of the transistor Tr6 to large changes in voltage. Therefore, the collector current of the transistor Tr6 can be kept at a low value to prevent the absolute value of the voltage drop across the resistor R5 from growing too large. That further lowers the power consumption by the power amplifier 1.

Furthermore, the gain of the power amplifier 1 exhibits limited control input voltage dependence. The control input voltage fed from an external circuit does not need to be highly precise. The mechanism facilitates designing the external circuit.

Next will be discussed adjustment of components of the bias circuit 22 in the power amplifier 1 of the present embodiment. FIGS. 2 and 3 show characteristics of the power amplifier 1 obtained from such adjustment of property values of components of the power amplifier 1 that the temperature characteristics and control input voltage characteristics of the amplification transistor Tr1 can cancel out.

Figure 14:
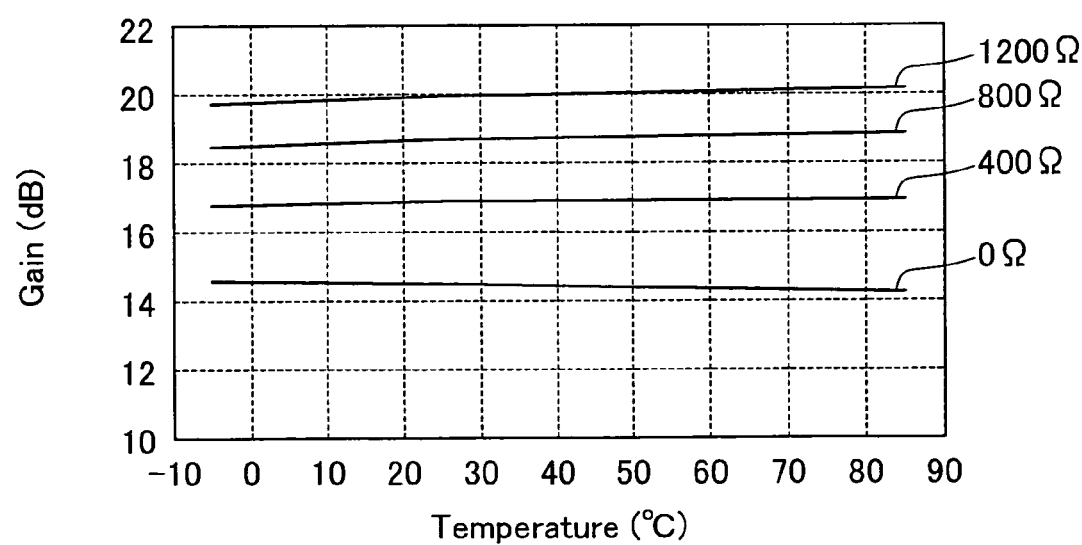
FIG. 14 is a graph representing the temperature dependence of the gain of the power amplifier shown in FIG. 1 for various adjusted property values of a component of the power amplifier as examples.

FIG. 14 is a graph representing adjusted property values of a component of the power amplifier 1 as examples. Specifically, the figure shows the temperature characteristics of the power amplifier 1 for various resistance values of the resistor R5. The resistor R5 was varied to 0Ω, 400Ω, 800Ω, and 1200Ω. The other components were assumed to have the same property values as those used in the simulation of the power amplifier 1 for FIGS. 2 and 3.

FIG. 14 demonstrates that the gain of the power amplifier 1 increases with increase in the resistance of the resistor R5. This is because an increase in the resistance of the resistor R5 increases the voltage drop across the resistor R5, which in turn increases the collector current of the amplification transistor Tr1. The figure also demonstrates that the gain of the power amplifier 1 is more likely to increase with increasing temperature at higher resistance values of the resistor R5. The collector current of the amplification transistor Tr1 is more likely to increase limitedly with increasing control input voltage at higher resistance values of the resistor R5 (not depicted in FIG. 14).

Thus, a property value (parameter) of a component generally alters more than one characteristic. On this account, intended characteristics are obtained by adjusting property values of multiple components interrelatedly. There exists an empirical approach of adjusting the collector current of the amplification transistor Tr1 or the gain of the power amplifier 1 without much disturbing desired characteristics (temperature characteristics and control input voltage characteristics) once the desired characteristics are obtained by restraining the temperature dependence and control input voltage dependence of the collector current or of the gain.

Figure 15:
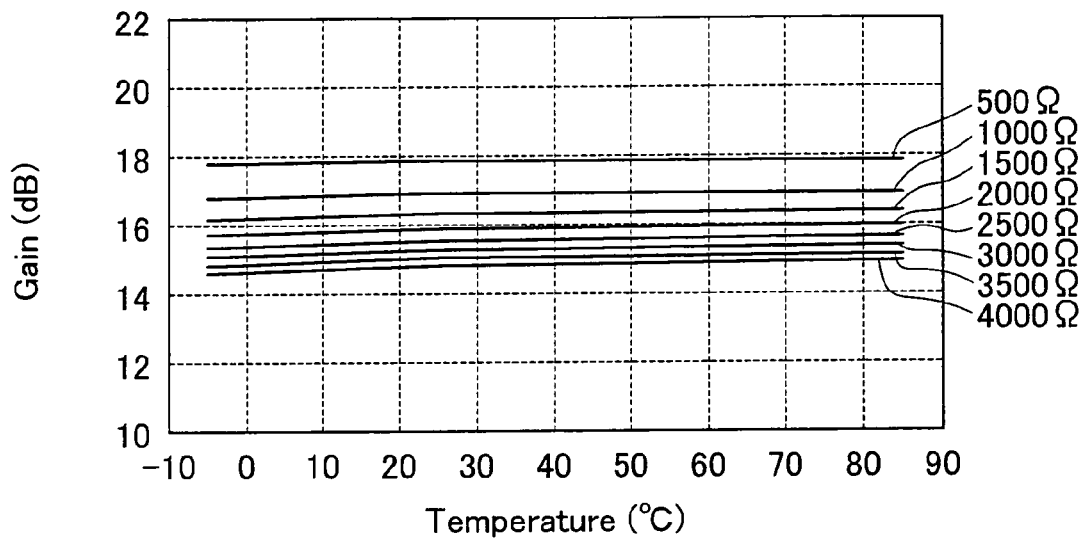
FIG. 15 is a graph representing the temperature dependence of the gain of the power amplifier shown in FIG. 1 for various adjusted property values of another component of the power amplifier as examples.
Figure 16:
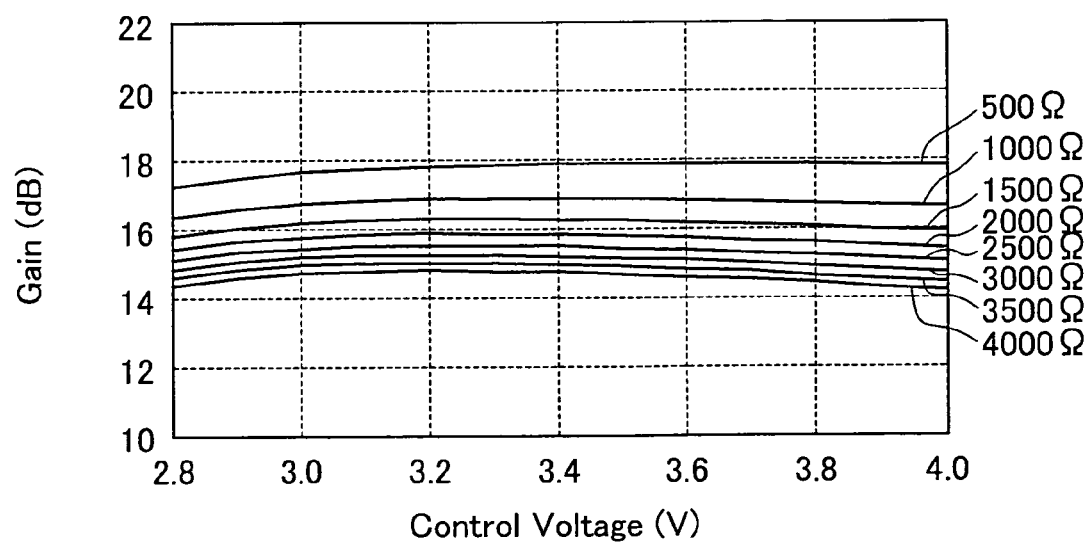
FIG. 16 is a graph representing the control input voltage dependence of the gain of the power amplifier shown in FIG. 1 for various adjusted property values of another component of the power amplifier as examples.

An example is the resistance value of the resistor R2. FIG. 15 shows temperature dependence of the gain of the power amplifier 1 for various resistance values of the resistor R2. FIG. 16 shows the control input voltage dependence of the gain of the power amplifier 1 for various resistance values of the resistor R2. In FIGS. 15 and 16, the resistance of the resistor R2 was increased from 500Ω to 4000Ω, in steps of 500Ω. FIGS. 15 and 16 demonstrate that changing the resistance of the resistor R2 results in a change in the gain of the power amplifier 1, but does not significantly affect the temperature dependence and control input voltage dependence. Similarly, by changing the size of the transistor Tr5 or the transistor Tr2, the gain of the power amplifier 1 can be adjusted without significantly affecting the temperature dependence and control input voltage dependence of the gain of the power amplifier 1.

Figure 17:
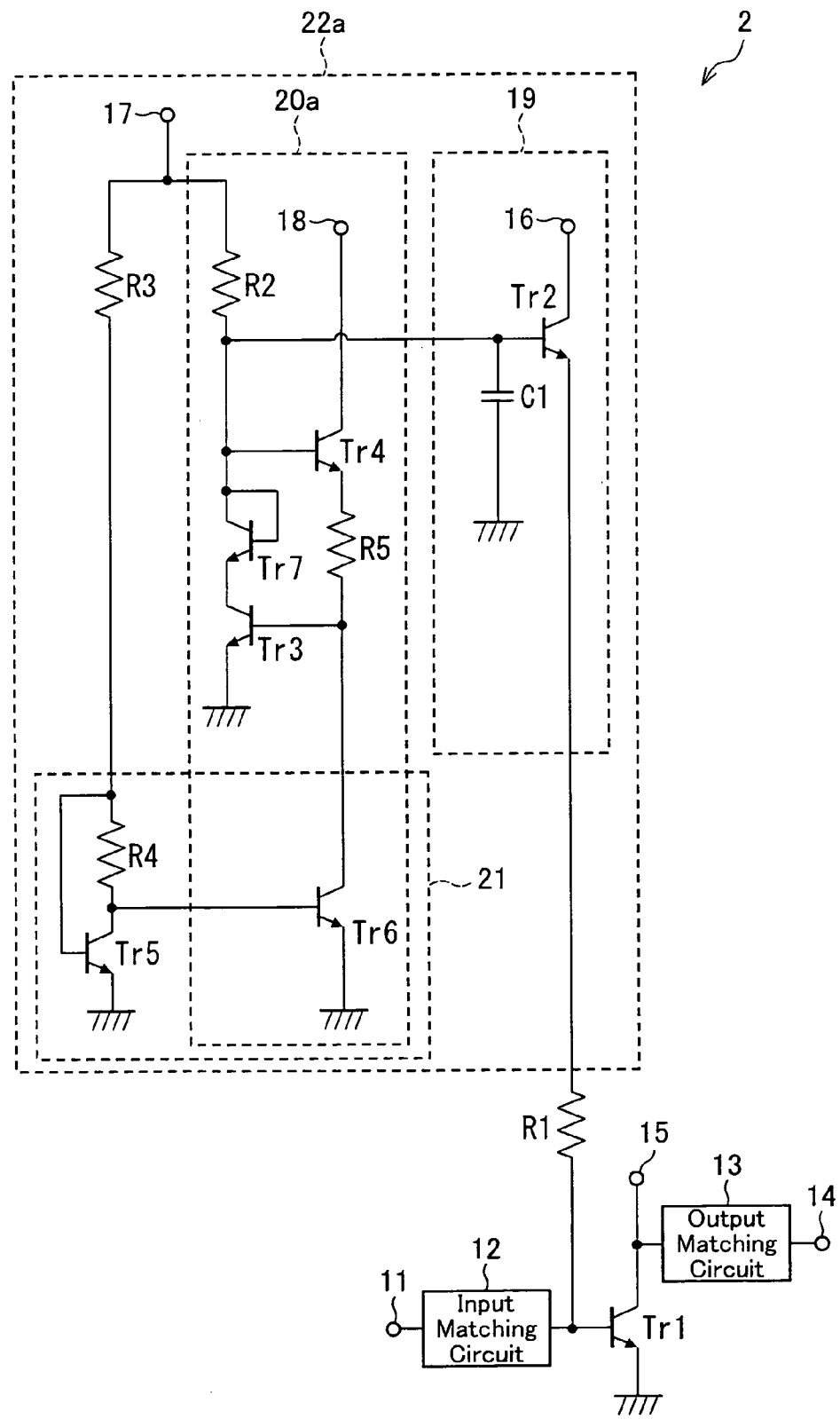
FIG. 17 is a schematic circuit diagram of a variation of the power amplifier shown in FIG. 1.

FIG. 17 is a schematic circuit diagram of a variation of the power amplifier 1 of the present embodiment, denoted by 2. The power amplifier 2 differs from the power amplifier 1 in that the VBE-controlled voltage source circuit 20a in the bias circuit (first bias circuit) 22a includes another transistor (fifth transistor) Tr7. Those members in the power amplifier 2 which have the same functions as members in the power amplifier 1 are indicated by the same reference numerals and description thereof is omitted.

The bias circuit 22a in the power amplifier 2 includes a linear compensation circuit 19, a VBE-controlled voltage source circuit 20a, a Nagata current mirror circuit 21, a control input terminal 17, and a resistor R3. The VBE-controlled voltage source circuit 20a includes transistors Tr3, Tr4, Tr6, Tr7 and resistors R2, R5. The bias circuit 22a has similar functions to the bias circuit 22. The VBE-controlled voltage source circuit 20a has similar functions to the VBE-controlled voltage source circuit 20.

The transistor Tr7 in the VBE-controlled voltage source circuit 20a has its base and collector connected together. The collector of the transistor Tr7 is connected to the base of the transistor Tr4 (terminal connected to the resistor R2). The emitter of the transistor Tr7 is connected to the collector of the transistor Tr3. In other words, the transistor Tr7 is provided between the collector of the transistor Tr3 and the base of the transistor Tr4.

The base-collector voltage of the transistor Tr3 in the power amplifier 2 is equal to the ON voltage (VBE) of the transistor Tr4. Therefore, the base-collector voltage of the transistor Tr3 is adjustable by inserting the transistor Tr7. A diode, resistor, or like component may be inserted in place of the transistor Tr7 to enable adjustment of the base-collector voltage of the transistor Tr3. If the transistor Tr7 has large early effect or changes its properties with heat generation temperature change, the operating conditions of the circuitry may be adjustable in some cases.

Embodiment 2

The following will describe another embodiment of the present invention in reference to FIGS. 18 to 21. Those members of the present embodiment which have the same functions as members of embodiment 1 are indicated by the same reference numerals and description thereof is omitted.

Figure 18:
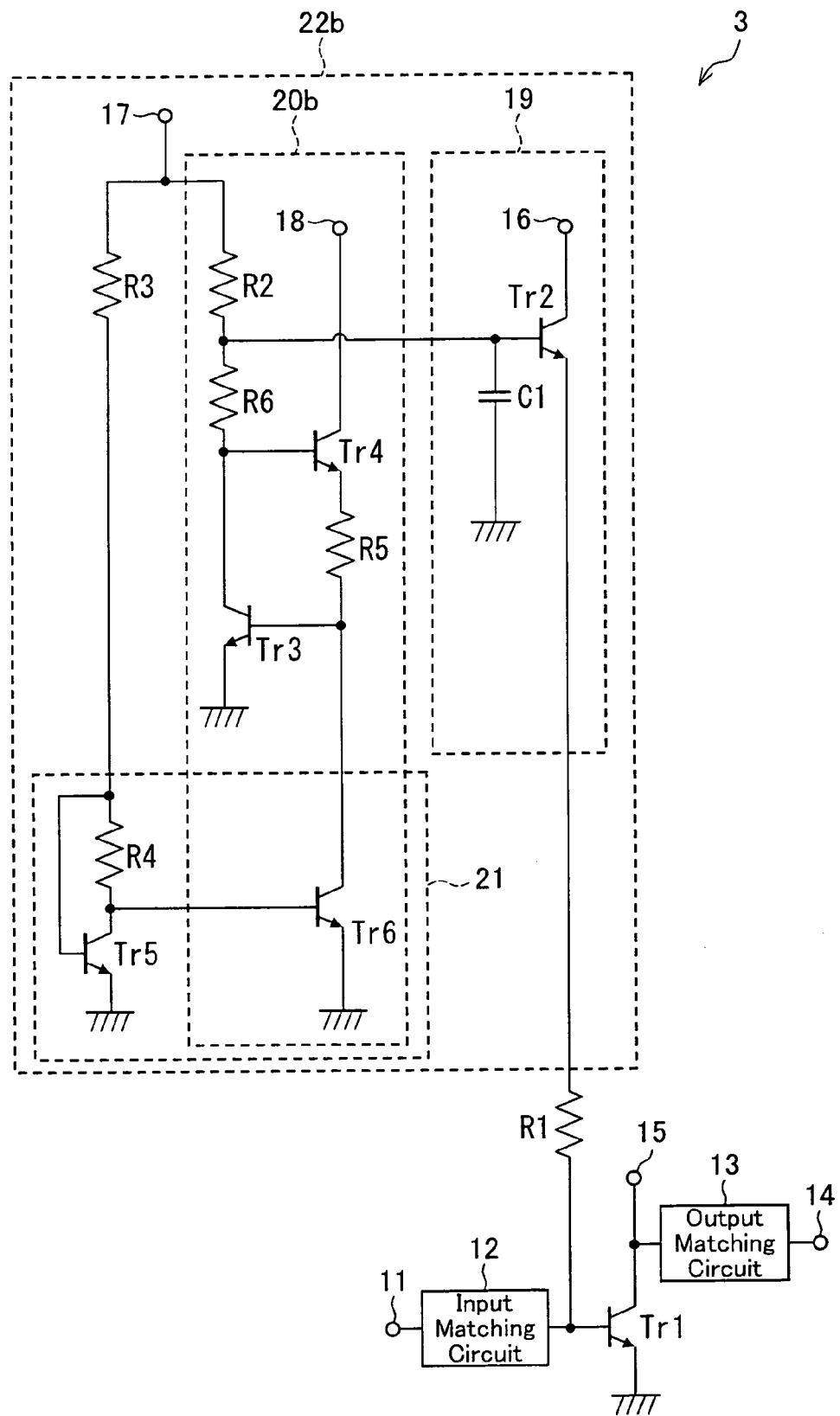
FIG. 18 is a schematic circuit diagram of a power amplifier in accordance with another embodiment of the present invention.

FIG. 18 is a schematic circuit diagram of a power amplifier of the present embodiment. A power amplifier 3 of the present embodiment differs from the power amplifier 1 of embodiment 1 in that the VBE-controlled voltage source circuit 20b in the bias circuit (first bias circuit) 22b includes a resistor (fifth resistor) R6.

The bias circuit 22b in the power amplifier 3 includes a linear compensation circuit 19, a VBE-controlled voltage source circuit 20b, a Nagata current mirror circuit 21, a control input terminal 17, and a resistor R3. The VBE-controlled voltage source circuit 20b includes transistors Tr3, Tr4, Tr6 and resistors R2, R5, R6. The bias circuit 22b has similar functions to the bias circuit 22. The VBE-controlled voltage source circuit 20b has similar functions to the VBE-controlled voltage source circuit 20.

The resistor R6 in the VBE-controlled voltage source circuit 20b gradually changes either the gain of the power amplifier 3 or the collector current of the amplification transistor Tr1 in the power amplifier 3 in response to a control input voltage. The resistor R6 is provided between the resistor R2 and the base of the transistor Tr4 as illustrated in FIG. 18. The base of the transistor Tr2 in the linear compensation circuit 19 is connected to a point between the resistors R2 and R6.

When either the gain of the power amplifier 3 or the collector current of the amplification transistor Tr1 in the power amplifier 3 is to be adjusted by adjusting a control input voltage, the gain of the power amplifier 3 or the collector current of the amplification transistor Tr1 preferably changes gradually in response to the control input voltage. However, in the structure of the power amplifier 1, the gain of the power amplifier 1 or the collector current of the amplification transistor Tr1 in the power amplifier 1 in some cases decreases with an increase in the control input voltage. Therefore, it could be difficult to adjust the gain of the power amplifier 1 or the collector current of the amplification transistor Tr1 in the power amplifier 1 through the adjustment of the control input voltage.

In the power amplifier 3, the flow electric current flow through the resistor R6 will likely increase with an increase in the control input voltage. The base voltage of the transistor Tr2 increases as much as an increase in the voltage drop across the resistor R6. That prevents, in the power amplifier 3, the collector current of the amplification transistor Tr1 from starting to decrease due to excess compensation of the control input voltage dependence of the power amplifier 1. The current flow through the resistor R6 increases with rising temperature and an increase in the bias voltage supplied from the power supply terminal 16 or the power supply terminal 18. Therefore, the gain of the power amplifier 3 can be increased while restraining variations in the gain.

Figure 19:
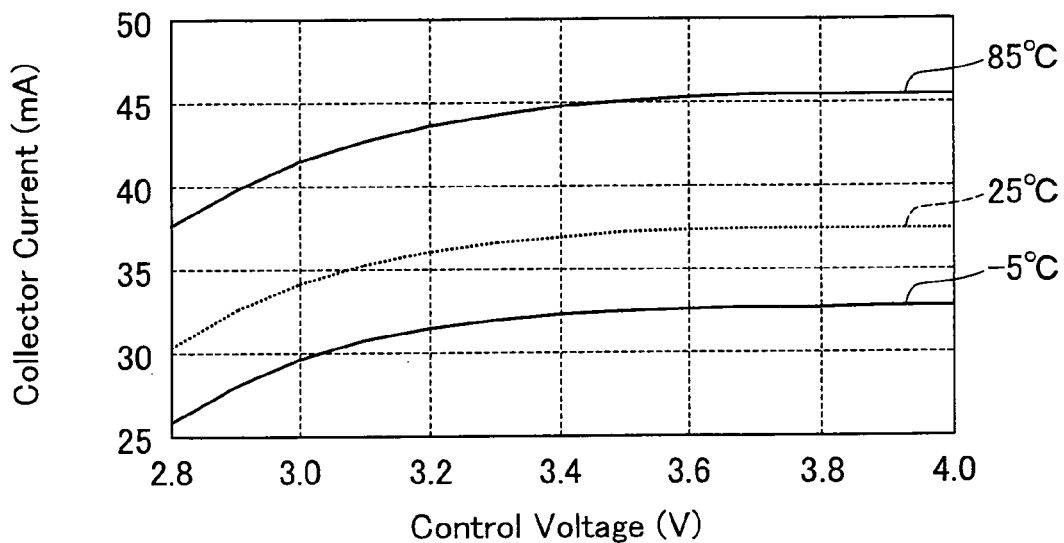
FIG. 19 is a graph representing the control input voltage dependence of the collector current of an amplification transistor in the power amplifier shown in FIG. 18.
Figure 20:
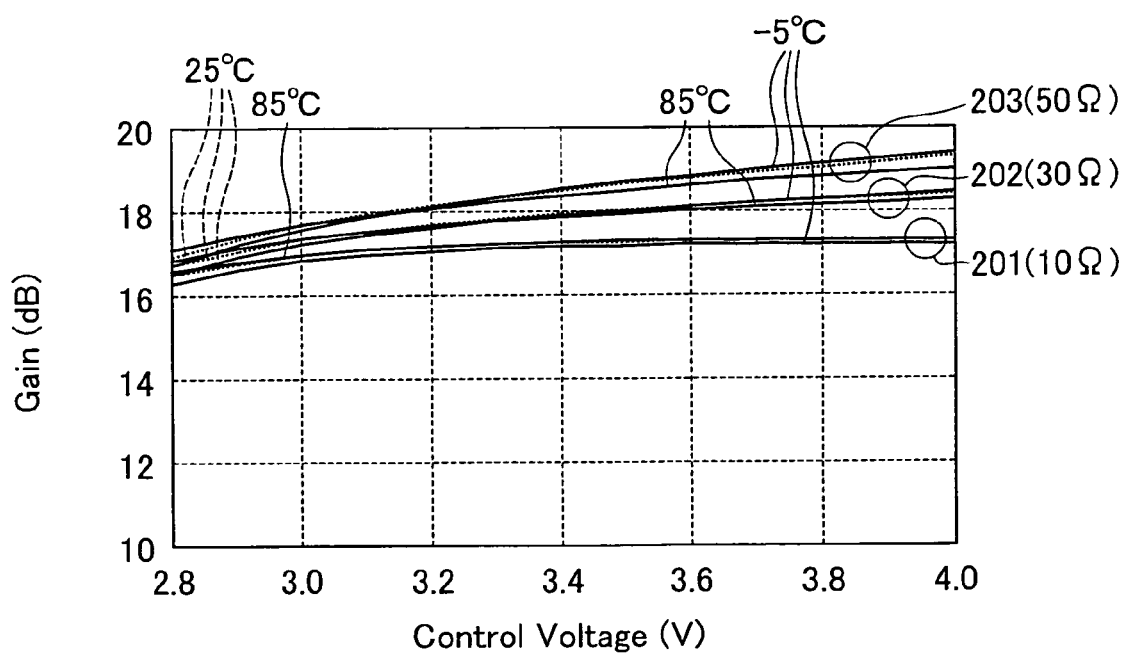
FIG. 20 is a graph representing the control input voltage dependence of the gain of the power amplifier shown in FIG. 18.

FIG. 19 is a graph representing the control input voltage dependence of the collector current of the amplification transistor Tr1 in the power amplifier 3. FIG. 20 is a graph representing the control input voltage dependence of the gain of the power amplifier 3.

FIGS. 19 and 20 show results of simulation of the control input voltage dependence at −5° C., 25° C., and 85° C. FIG. 20 assumed, in plotting the gain of the power amplifier 3, that the power amplifier 3 was operating at 2 GHz. Also in FIG. 20, maximum stable gains (dB) were plotted to remove effects of the input matching circuit 12 and the output matching circuit 13.

FIG. 19 assumed that the resistor R6 was 10Ω. FIG. 20 assumed plural resistance values for the resistor R6: 10Ω for line 201, 30Ω for line 202, and 50Ω for line 203. The components other than the resistor R6 were assumed to have the same property values as those used in the simulation of the power amplifier 1 for FIGS. 2 and 3.

FIGS. 19 and 20 demonstrate that the power amplifier 3 is well adjusted to exhibit relatively good temperature characteristics: more specifically, the collector current of the amplification transistor Tr1 and the gain of the power amplifier 3 gradually increase with an increase in the control input voltage.

In the simulation for FIG. 20, it was only the resistance of the resistor R6 that was varied to adjust the control input voltage dependence of the gain of the power amplifier 3 or the collector current of the amplification transistor Tr1 in the power amplifier 3. This is not the only possibility. It may be a property value of another component that is varied. For example, if the resistances of the resistors R4, R5, are increased, the gain of the power amplifier 3 consequently increases with rising temperature. In addition, under the same conditions, the gain of the power amplifier 3 decreases with an increase in the control input voltage fed from control input terminal 17. Therefore, by adjusting the property values of these components can be achieved both low temperature dependence of the gain by the power amplifier 3 and low control input voltage dependence of the gain of the power amplifier 3.

Figure 21:
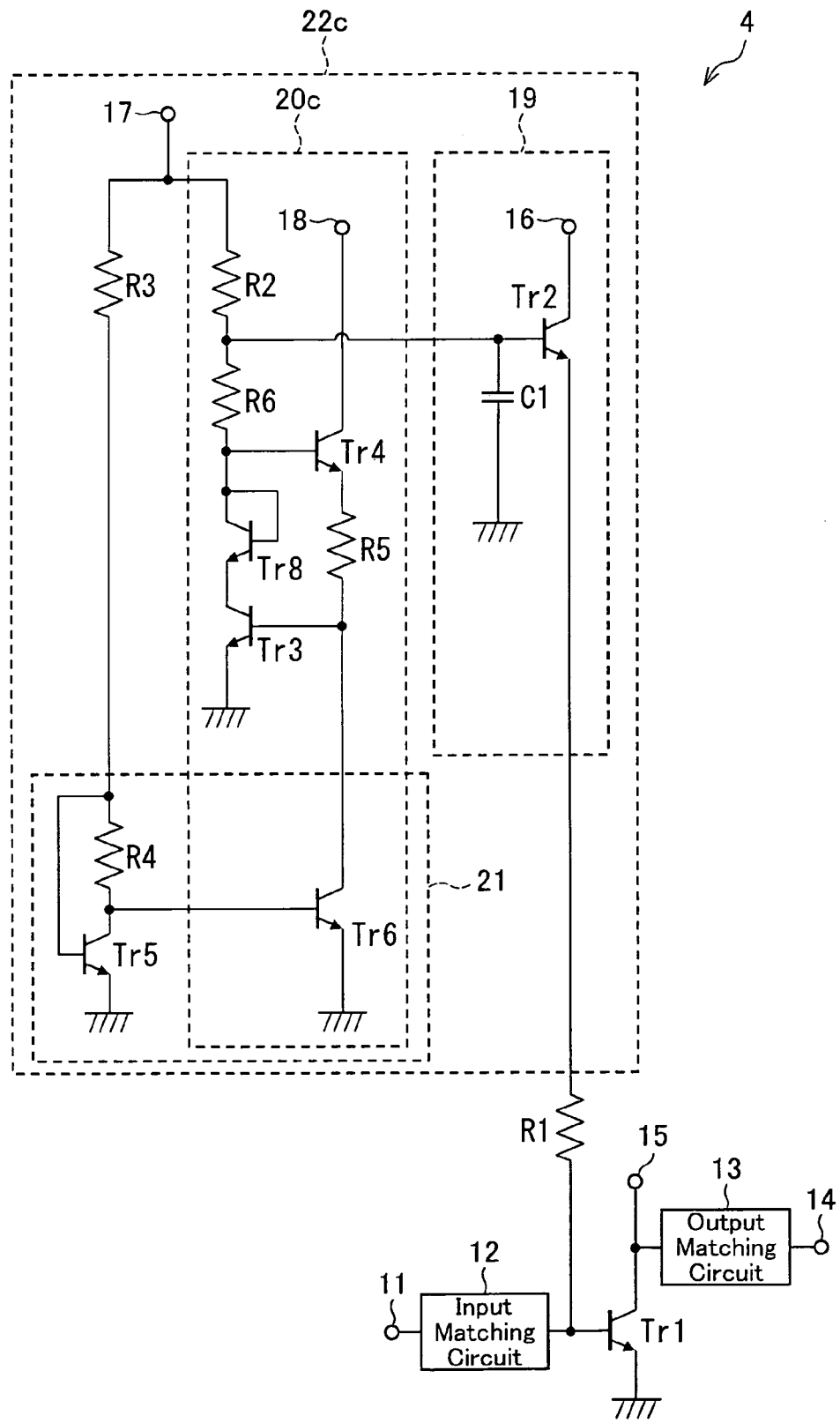
FIG. 21 is a schematic circuit diagram of a variation of the power amplifier shown in FIG. 18.

FIG. 21 is a schematic circuit diagram of a variation of the power amplifier 3 of the present embodiment, denoted by 4. The power amplifier 4 differs from the power amplifier 3 in that the VBE-controlled voltage source circuit 20c in the bias circuit (first bias circuit) 22c includes another transistor (fifth transistor) Tr8. Those members in the power amplifier 4 which have the same functions as members in the power amplifier 3 are indicated by the same reference numerals and description thereof is omitted.

The bias circuit 22c in the power amplifier 4 includes a linear compensation circuit 19, a VBE-controlled voltage source circuit 20c, a Nagata current mirror circuit 21, a control input terminal 17, and a resistor R3. The VBE-controlled voltage source circuit 20c includes transistors Tr3, Tr4, Tr6, Tr8 and resistors R2, R5. The bias circuit 22c has similar functions to the bias circuit 22. The VBE-controlled voltage source circuit 20c has similar functions to the VBE-controlled voltage source circuit 20.

The transistor Tr8 in the VBE-controlled voltage source circuit 20c has its base and collector connected together. The collector of the transistor Tr8 is connected to the base of the transistor Tr4. The emitter of the transistor Tr8 is connected to the collector of the transistor Tr3. In other words, the transistor Tr8 is provided between the collector of the transistor Tr3 and the base of the transistor Tr4.

The base-collector voltage of the transistor Tr3 in the power amplifier 4 is equal to the ON voltage (VBE) of the transistor Tr4. Therefore, the base-collector voltage of the transistor Tr3 is adjustable by inserting the transistor Tr8. A diode, resistor, or like component may be inserted in place of the transistor Tr8 to enable adjustment of the base-collector voltage of the transistor Tr3. If the transistor Tr8 has large early effect or changes its properties with self-heating temperature change, the operating conditions of the circuitry may be adjustable in some cases.

Embodiment 3

Figure 22:
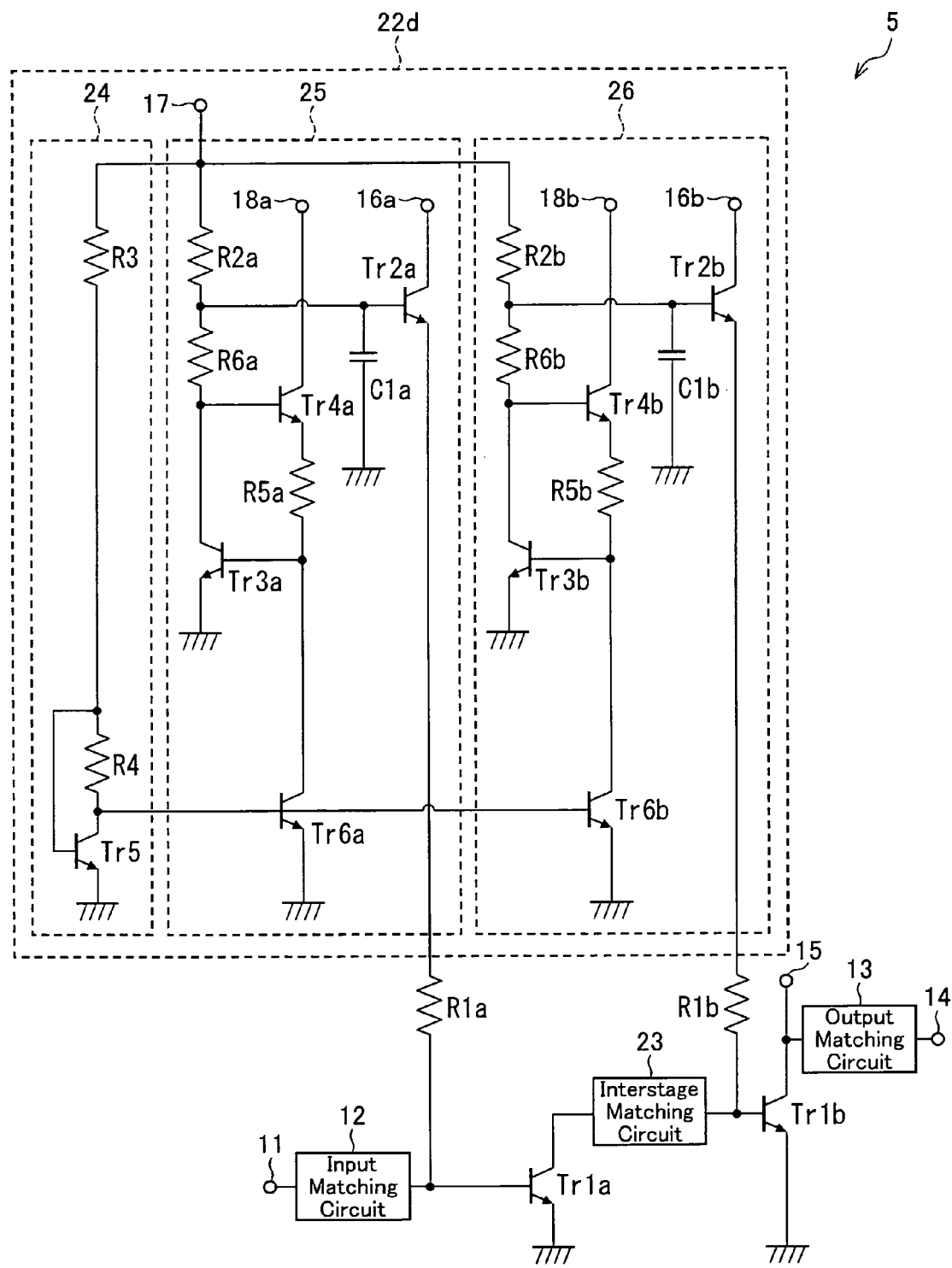
FIG. 22 is a schematic circuit diagram of a power amplifier in accordance with a further embodiment of the present invention.

The following will describe another embodiment of the present invention in reference to FIG. 22. Those members of the present embodiment which have the same functions as members of embodiments 1, 2 are indicated by the same reference numerals and description thereof is omitted.

FIG. 22 is a schematic circuit diagram of a power amplifier of the present embodiment. The power amplifier (multistage amplification circuit) 5 of the present embodiment differs from the power amplifiers 1 to 4 of embodiments 1, 2 in that the power amplifier 5 includes two amplification transistors connected to each other and adapted so that a bias circuit can produce a mirror current in each stage.

The power amplifier 5 includes, as illustrated in FIG. 22, an input matching circuit 12, an amplification transistor (first amplification transistor) Tr1a, an interstage matching circuit 23, another amplification transistor (third amplification transistor) Tr1b, an output matching circuit 13, and a bias circuit 22d. The amplification transistor Tr1a has its base connected to the input signal terminal 11 of the power amplifier 5 via the input matching circuit 12. The amplification transistor Tr1a has its collector connected to the base of the amplification transistor Tr1b via the interstage matching circuit 23. The amplification transistor Tr1b has its collector connected to the output signal terminal 14 of the power amplifier 5 via the output matching circuit 13. In the power amplifier 5 thus configured, high frequency signals fed at the input signal terminal 11 are amplified by the amplification transistors Tr1a and Tr1b for output at the output signal terminal 14.

The base of the amplification transistor Tr1a is connected via the resistor R1a to the emitter of the transistor (first biasing transistor) Tr2a in the first bias circuit 25 (detailed later). Likewise, the base of the amplification transistor Tr1b is connected via the resistor R1b to the emitter of the transistor (third biasing transistor) Tr2b in a second bias circuit (third bias circuit) 26 (detailed later). The collector of the amplification transistor Tr1b is connected to the power supply terminal 15 from which the amplification transistor Tr1b receives a bias voltage supply. The emitters of the amplification transistor Tr1a and the amplification transistor Tr1b are both grounded. The resistor R1b has the same functions as the resistor R1a.

The bias circuit 22d has the same functions as the bias circuit 22 and includes the control input terminal 17, a reference current generating circuit 24, the first bias circuit 25, and the second bias circuit 26. The reference current generating circuit 24 includes a transistor Tr5 and the resistors R3, R4. The first bias circuit 25 includes transistors Tr2a, Tr3a, Tr4a, Tr6a, resistors R2a, R5a, R6a, a capacitor C1a, and power supply terminals 16a, 18a. The second bias circuit 26 includes transistors Tr2b, Tr3b, Tr4b, Tr6b, resistors R2b, R5b, R6b, a capacitor C1b, and power supply terminals 16b, 18b.

The transistors Tr2a, Tr2b have the same functions as the transistor Tr2. Likewise, the transistor (second transistor) Tr3a and transistor (eighth transistor) Tr3b have the same functions as the transistor Tr3; the transistor (first transistor) Tr4a and the transistor (seventh transistor) Tr4b have the same functions as the transistor Tr4; and the transistor (fourth transistor) Tr6a and the transistor (ninth transistor) Tr6b have the same functions as the transistor Tr6. In addition, the resistors R2a, R2b have the same functions as the resistor R2; the resistors R5a, R5b have the same functions as the resistor R5; and the resistors R6a, R6b have the same functions as the resistor R6. Furthermore, the capacitors C1a, C1b have the same functions as the capacitor C1; the power supply terminals 16a, 16b have the same functions as the power supply terminal 16; and the power supply terminals 18a, 18b have the same functions as the power supply terminal 18.

In this configuration, the control input terminal 17 is connected commonly to the resistor R3 of the reference current generating circuit 24, the resistor R2a of the first bias circuit 25, and the resistor (seventh resistor) R2b of the second bias circuit 26. The bases of the transistor Tr6a of the first bias circuit 25 and the transistor Tr6b of the second bias circuit 26 are connected commonly to the collector of the transistor Tr5 of the reference current generating circuit 24.

Therefore, the reference current generating circuit 24, the transistor Tr6a of the first bias circuit 25, and the transistor Tr6b of the second bias circuit 26 provide, in the power amplifier 5, an equivalent structure to the Nagata current mirror circuit 21 in the power amplifiers 1 to 4 of embodiments 1, 2. The configuration enables each transistor Tr6a, Tr6b in the power amplifier 5 to produce a mirror current. Hence, variations in the gain of each amplification transistor can be reduced similarly to embodiments 1, 2.

In the power amplifier 5, the reference current generating circuit 24 can be shared commonly among the amplification transistors; there is no need to provide a separate reference current generating circuit for each amplification transistor. That lowers current consumption by the bias circuit 22d and reduces the footprint of the power amplifier which includes multistage amplification transistors, which in turn allows for designing compact and low cost power amplifiers.

In the power amplifier 5, the degree of temperature compensation is adjustable through the separate adjustment of the resistors R5a, R5b.

The first bias circuit 25 and the second bias circuit 26 in the power amplifier 5 have the same configuration as the power amplifier 3 of embodiment 2; this is not the only possibility. The circuits 25 and 26 may have the same configuration as the power amplifiers 1, 2 of embodiment 1 or the power amplifier 4 of embodiment 2. The power amplifier 5 contains two-staged amplification transistors, as well as the input matching circuit 12, the amplification transistor Tr1a, the interstage matching circuit 23, the amplification transistor Tr1b, and the output matching circuit 13; this is not the only possibility. The configuration is also applicable to power amplifiers which contain three- or more-staged amplification transistors.

Embodiment 4

Figure 23:
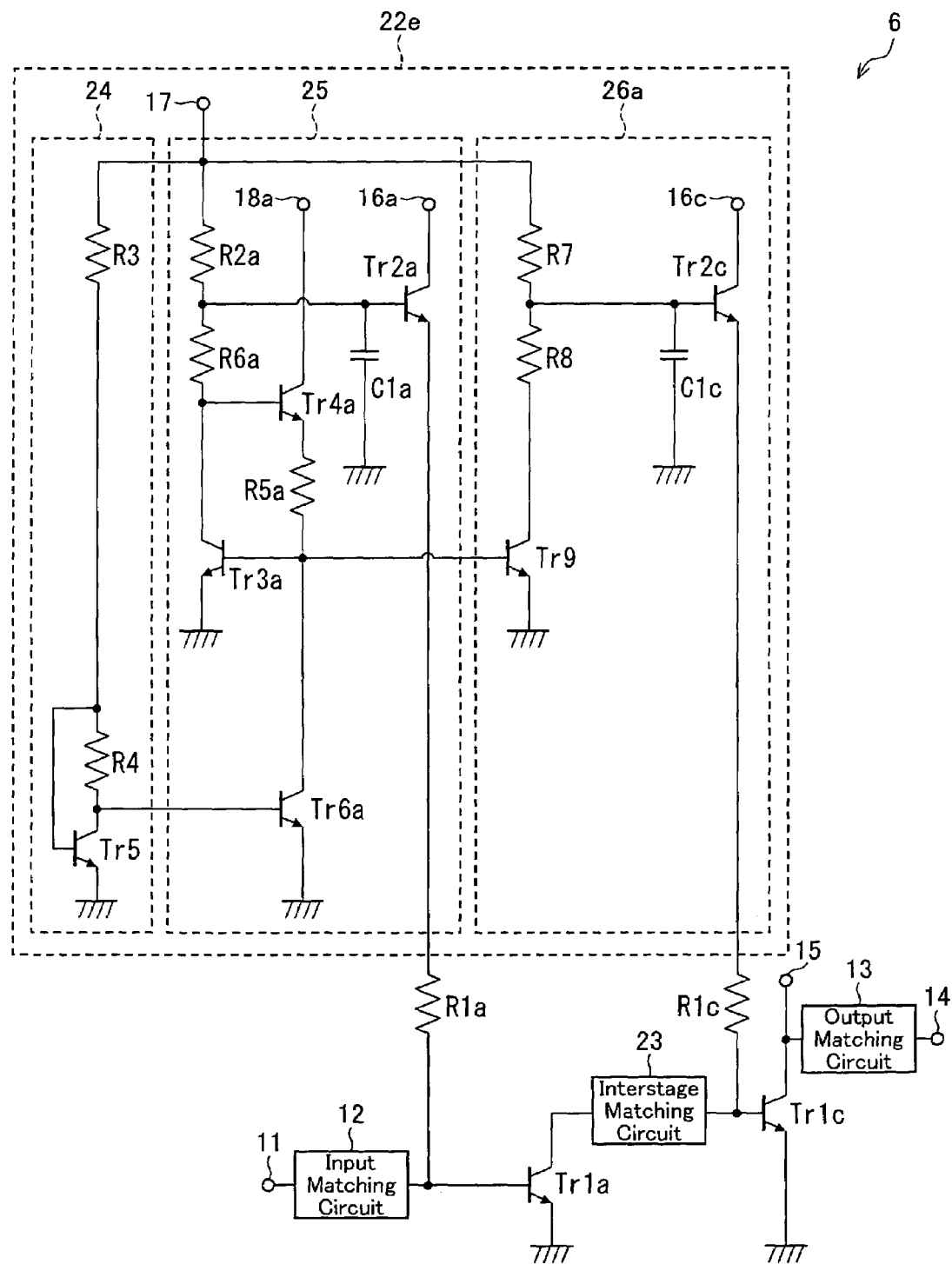
FIG. 23 is a schematic circuit diagram of a power amplifier in accordance with still another embodiment of the present invention.

The following will describe another embodiment of the present invention in reference to FIG. 23. Those members of the present embodiment which have the same functions as members of embodiments 1 to 3 are indicated by the same reference numerals and description thereof is omitted.

FIG. 23 is a schematic circuit diagram of a power amplifier of the present embodiment. The power amplifier (multistage amplification circuit) 6 of the present embodiment differs from the power amplifier 5 of embodiment 3 in that the power amplifier 6 includes a second bias circuit 26a in a bias circuit 22e. The bias circuit 22e has similar functions to the bias circuit 22. The amplification transistor (second amplification transistor) Tr1c and the resistor R1c have the same functions as the amplification transistor Tr1b and the resistor R1b.

The second bias circuit 26a includes transistors (second biasing transistors) Tr2c, Tr9, resistors R7, R8, a capacitor C1c, and a power supply terminal 16c. The transistor Tr2c has the same functions as the transistor Tr2. The capacitor C1c has the same functions as the capacitor C1. The power supply terminal 16c has the same functions as the power supply terminal 16.

The transistor (sixth transistor) Tr9 has its base connected to the base of the transistor Tr3a and its collector to the control input terminal 17 via the resistors R8, R7. Specifically, the collector of the transistor Tr9 is connected to an end of the resistor R8. The control input terminal 17 is connected to an end of the resistor (sixth resistor) R7. The other end of the resistor R7 and the other end of the resistor R8 are connected to each other at a contact which in turn connects to the base of the transistor Tr2c.

So, the transistors Tr3a and Tr9 provide a current mirror circuit. The collector current of the transistor Tr3a acts as a reference current, and the collector current of the transistor Tr9 acts as a mirror current. Since the resistors R2a, R7 have an equal resistance, the same amount of current flows through the resistor R7 as through the resistor R2a. The resistors R2a, R7 cause equal voltage drops to the control input voltage.

Therefore, in the power amplifier 6, the base voltage of the transistor Tr2a and the base voltage of the transistor Tr2c are controlled to the same voltage value regardless changes in the control input voltage. Accordingly, the power amplifier 6, similarly to embodiment 3, can restrain variations in the gain of each amplification transistor.

The second bias circuit 26a in the power amplifier 6 contains fewer components than the second bias circuit 26 in the power amplifier 5 as illustrated in FIG. 23. The power amplifier 6 needs no transistor Tr6b because the transistors Tr3a, Tr9 are connected at their bases.

The configuration further lowers power consumption by the bias circuit 22e in the power amplifier 6 and reduces footprint of the power amplifier 6 which includes multistage amplification transistors, which in turn allows for designing more compact and lower cost power amplifiers.

The first bias circuit 25 in the power amplifier 6 has the same configuration as the power amplifier 3 of embodiment 2 as is the case with the power amplifier 5; this is not the only possibility. The circuit 25 may have the same configuration as the power amplifiers 1, 2 of embodiment 1 or the power amplifier 4 of embodiment 2.

In the power amplifier 6, the collector of the transistor Tr3a, constituting part of the current mirror circuit, is connected to the resistor R2a via the resistor R6a. Therefore, a resistor R8 with an equal resistance to the resistor R6a may be inserted between the collector of the transistor Tr9 and the resistor R7 so as to operate the current mirror circuit more accurately.

When the first bias circuit 25 in the power amplifier 6 has the same configuration as the power amplifier 1 of embodiment 1, the first bias circuit 25 includes no resistor R6a so that the collector of the transistor Tr3a is connected directly to the resistor R2a. Therefore, the collector of the transistor Tr9 should be connected directly to the resistor R7 by removing the resistor R8 from the second bias circuit 26a, so as to more accurately operate the current mirror circuit provided by the transistors Tr3a, Tr9.

The power amplifier 6 contains two-staged amplification transistors, as well as the input matching circuit 12, the amplification transistor Tr1a, the interstage matching circuit 23, the amplification transistor Tr1c, and the output matching circuit 13; this is not the only possibility. The configuration is also applicable to power amplifiers which contain three- or more-staged amplification transistors.

In the power amplifier 6, the amplification transistor Tr1a acts as the first-stage amplification transistor, and the amplification transistor Tr1c acts as the second-stage amplification transistor; this is not the only possibility. The first- and second-stages may be reversed with some changes, if necessary, made to the structure of the bias circuit 22d.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

As described in the foregoing, the power amplifier in accordance with the present invention is, to address the problems, characterized in that it includes a first amplification transistor for amplifying an input signal and a first bias circuit for supplying a bias current to the first amplification transistor, wherein:

the first bias circuit includes: a first biasing transistor for supplying the bias current to a base of the first amplification transistor; a control input terminal to which a control input voltage is fed as a control signal for controlling amplification by the first amplification transistor; a VBE-controlled voltage source circuit; and a current mirror circuit, the VBE-controlled voltage source circuit includes: a first resistor provided between the control input terminal and a base of the first biasing transistor; a first transistor having a base connected to the first resistor and to the base of the first biasing transistor; and a second transistor having an emitter grounded, a base connected to an emitter of the first transistor, and a collector connected to the base of the first transistor, and the current mirror circuit includes: a third transistor having an emitter grounded, a base connected to the control input terminal via a second resistor, and a collector connected to the base of the third transistor via a third resistor; and a fourth transistor having an emitter grounded, a base connected to the collector of the third transistor, and a collector connected to the base of the second transistor.

In the arrangement, the power amplifier includes a first bias circuit which includes a first biasing transistor for supplying a bias current to the base of a first amplification transistor. The first bias circuit includes a VBE-controlled voltage source circuit and a current mirror circuit.

The VBE-controlled voltage source circuit includes: a first resistor provided between a control input terminal and the base of the first biasing transistor; a first transistor with its base connected to the first resistor and to the base of the first biasing transistor; and a second transistor with its emitter grounded, its base connected to the emitter of the first transistor, and its collector connected to the base of the first transistor.

The current mirror circuit includes: a third transistor with its emitter grounded, its base connected to the control input terminal via a second resistor, and its collector connected to the base of the third transistor via a third resistor; and a fourth transistor with its emitter grounded, its base connected to the collector of the third transistor, and its collector connected to the base of the second transistor. The fourth transistor operates as a current source for the VBE-controlled voltage source circuit.

The power amplifier in accordance with the present invention may further include a fourth resistor provided between the emitter of the first transistor and the base of the second transistor, wherein the collector of the fourth transistor is connected to the base of the second transistor and also, via the fourth resistor, to the emitter of the first transistor.

The power amplifier in accordance with the present invention may further include a fifth resistor provided between the base of the first biasing transistor and the base of the first transistor, wherein the collector of the second transistor is connected to the base of the first transistor and also, via the fifth resistor, to the base of the first biasing transistor and to the first resistor.

The power amplifier in accordance with the present invention may further include a fifth transistor provided between the base of the first transistor and the collector of the second transistor, the fifth transistor having a collector connected to a base thereof and also to the base of the first transistor and an emitter connected to the collector of the second transistor.

The power amplifier in accordance with the present invention may be such that: the control input terminal is made up of a first control input terminal and a second control input terminal; the first control input terminal is connected to the base of the first biasing transistor via the first resistor; the second control input terminal is connected to the base of the third transistor via the second resistor; and the first and second control input terminals are power supply terminals delivering equal voltage changes.

A multistage amplification circuit in accordance with the present invention may include the power amplifier and a plurality of amplification transistors, wherein:

the multistage amplification circuit includes the first amplification transistor and a second amplification transistor as the plurality of amplification transistors and further includes a second bias circuit for supplying a bias current to the second amplification transistor, and the second bias circuit includes: a second biasing transistor for supplying the bias current to a base of the second amplification transistor; a sixth resistor provided between the control input terminal and a base of the second biasing transistor; and a sixth transistor having an emitter grounded, a base connected to the base of the second transistor, and a collector connected to the base of the second biasing transistor and to the sixth resistor.

Another multistage amplification circuit in accordance with the present invention may include the power amplifier and a plurality of amplification transistors, wherein:

the multistage amplification circuit includes the first amplification transistor and a third amplification transistor as the plurality of amplification transistors and further includes a third bias circuit for supplying a bias current to the third amplification transistor; and the third bias circuit includes: a third biasing transistor for supplying the bias current to a base of the third amplification transistor; a seventh resistor provided between the control input terminal and a base of the third biasing transistor; a seventh transistor having a base connected to the seventh resistor and to the base of the third biasing transistor; an eighth transistor having an emitter grounded, a base connected to an emitter of the seventh transistor, and a collector connected to a base of the seventh transistor; and a ninth transistor having an emitter grounded, a collector connected to the base of the eighth transistor, and a base connected to the collector of the third transistor.

In the arrangement, the multistage amplification circuit further includes a third bias circuit, as well as the first bias circuit. The third bias circuit includes a seventh resistor, a seventh transistor, and an eighth transistor. This structure has similar functions to the VBE-controlled voltage source circuit. In addition, the third bias circuit, which includes a ninth transistor, operates as a current source for the VBE-controlled voltage source circuit similarly to the fourth transistor. The base of the ninth transistor is connected to the collector of the third transistor.

The power amplifier in accordance with the present invention is suitable for use in mobile phones and communications devices used as wireless network devices where the power amplifier is expected to exhibit low temperature and control input voltage dependence.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and the scope of the invention as hereinafter claimed.

What is claimed is:

1. A power amplifier, comprising a first amplification transistor for amplifying an input signal and a first bias circuit for supplying a bias current to the first amplification transistor, wherein:

the first bias circuit includes:

a first biasing transistor for supplying the bias current to a base of the first amplification transistor;

a control input terminal to which a control input voltage is fed as a control signal for controlling amplification by the first amplification transistor;

a VBE-controlled voltage source circuit; and a current mirror circuit, the VBE-controlled voltage source circuit includes:

a first resistor provided between the control input terminal and a base of the first biasing transistor;

a first transistor having a base connected to the first resistor and to the base of the first biasing transistor; and a second transistor having an emitter grounded, a base connected to an emitter of the first transistor, and a collector connected to the base of the first transistor, and the current mirror circuit includes:

a third transistor having an emitter grounded, a base connected to the control input terminal via a second resistor, and a collector connected to the base of the third transistor via a third resistor; and a fourth transistor having an emitter grounded, a base connected to the collector of the third transistor, and a collector connected to the base of the second transistor.

2. The power amplifier of claim 1, further comprising a fourth resistor provided between the emitter of the first transistor and the base of the second transistor, wherein the collector of the fourth transistor is connected to the base of the second transistor and also, via the fourth resistor, to the emitter of the first transistor.

3. The power amplifier of claim 1, further comprising a fifth resistor provided between the base of the first biasing transistor and the base of the first transistor, wherein the collector of the second transistor is connected to the base of the first transistor and also, via the fifth resistor, to the base of the first biasing transistor and to the first resistor.

4. The power amplifier of claim 1, further comprising a fifth transistor provided between the base of the first transistor and the collector of the second transistor, the fifth transistor having a collector connected to a base thereof and also to the base of the first transistor and an emitter connected to the collector of the second transistor.

5. The power amplifier of claim 1, wherein:
the control input terminal is made up of a first control input terminal and a second control input terminal;
the first control input terminal is connected to the base of the first biasing transistor via the first resistor;
the second control input terminal is connected to the base of the third transistor via the second resistor; and
the first and second control input terminals are power supply terminals delivering equal voltage changes.

6. A multistage amplification circuit, comprising the power amplifier of claim 1 and a plurality of amplification transistors, wherein:
the multistage amplification circuit comprises the first amplification transistor and a second amplification transistor as the plurality of amplification transistors and further comprises a second bias circuit for supplying a bias current to the second amplification transistor, and
the second bias circuit includes:
a second biasing transistor for supplying the bias current to a base of the second amplification transistor;
a sixth resistor provided between the control input terminal and a base of the second biasing transistor; and
a sixth transistor having an emitter grounded, a base connected to the base of the second transistor, and a collector connected to the base of the second biasing transistor and to the sixth resistor.

7. A multistage amplification circuit, comprising the power amplifier of claim 1 and a plurality of amplification transistors, wherein:
the multistage amplification circuit comprises the first amplification transistor and a third amplification transistor as the plurality of amplification transistors and further comprises a third bias circuit for supplying a bias current to the third amplification transistor; and
the third bias circuit includes:
a third biasing transistor for supplying the bias current to a base of the third amplification transistor;
a seventh resistor provided between the control input terminal and a base of the third biasing transistor;
a seventh transistor having a base connected to the seventh resistor and to the base of the third biasing transistor;
an eighth transistor having an emitter grounded, a base connected to an emitter of the seventh transistor, and a collector connected to a base of the seventh transistor; and
a ninth transistor having an emitter grounded, a collector connected to the base of the eighth transistor, and a base connected to the collector of the third transistor.

* * * * *